United States Patent
Endo et al.

(10) Patent No.: US 6,829,039 B2
(45) Date of Patent: Dec. 7, 2004

(54) OPTICAL MEMBER FOR PHOTOLITHOGRAPHY AND METHOD OF EVALUATING THE SAME

(75) Inventors: Kazumasa Endo, Kawasaki (JP); Hiroyuki Hiraiwa, Yokohama (JP); Kazuhiro Nakagawa, Sagamihara (JP); Masaaki Mochida, Yamato (JP)

(73) Assignee: Nikon Corporation, Tokyo (JP)

( * ) Notice: Subject to any disclaimer, the term of this patent is extended or adjusted under 35 U.S.C. 154(b) by 7 days.

(21) Appl. No.: 10/362,193

(22) PCT Filed: Jul. 5, 2002

(86) PCT No.: PCT/JP02/06863
§ 371 (c)(1),
(2), (4) Date: Feb. 21, 2003

(87) PCT Pub. No.: WO03/004987
PCT Pub. Date: Jan. 16, 2003

(65) Prior Publication Data
US 2003/0174300 A1 Sep. 18, 2003

(30) Foreign Application Priority Data

Jul. 5, 2001 (JP) .................................... P2001-204221
Jan. 8, 2002 (JP) .................................... P2002-001045

(51) Int. Cl.$^7$ ................. G03B 27/42; G03B 27/72; G03B 27/32
(52) U.S. Cl. ................. 355/53; 355/71; 355/77
(58) Field of Search ............... 355/52, 53, 67, 355/77; 356/124.5, 124

(56) References Cited

U.S. PATENT DOCUMENTS 6,272,392 B1 * 8/2001 Capodieci .................. 700/110
6,498,685 B1 * 12/2002 Johnson ..................... 359/626
6,639,651 B2 * 10/2003 Matsuyama ................. 355/52

FOREIGN PATENT DOCUMENTS

| JP | A 3-225259 | 10/1991 |
| JP | A 8-5505 | 1/1996 |
| JP | A 11-311600 | 11/1999 |
| JP | A 2000-121491 | 4/2000 |

* cited by examiner

*Primary Examiner*—Alan Mathews
(74) *Attorney, Agent, or Firm*—Oliff & Berridge PLC

(57) ABSTRACT

A method of evaluating a refractive index homogeneity of an optical member for photolithography, the method comprising:

a measurement step of transmitting light having a predetermined wavelength $\lambda$ through the optical member so as to measure a wavefront aberration;

a Zernike fitting step of expanding thus measured wavefront aberration into a polynomial of a Zernike cylindrical function system;

a first separating step of separating individual components of the polynomial into a rotationally symmetric element, an odd-symmetric element, and an even-symmetric element; and a second separating step of separating individual components of the polynomial into a plurality of parts according to a degree thereof.

23 Claims, 11 Drawing Sheets

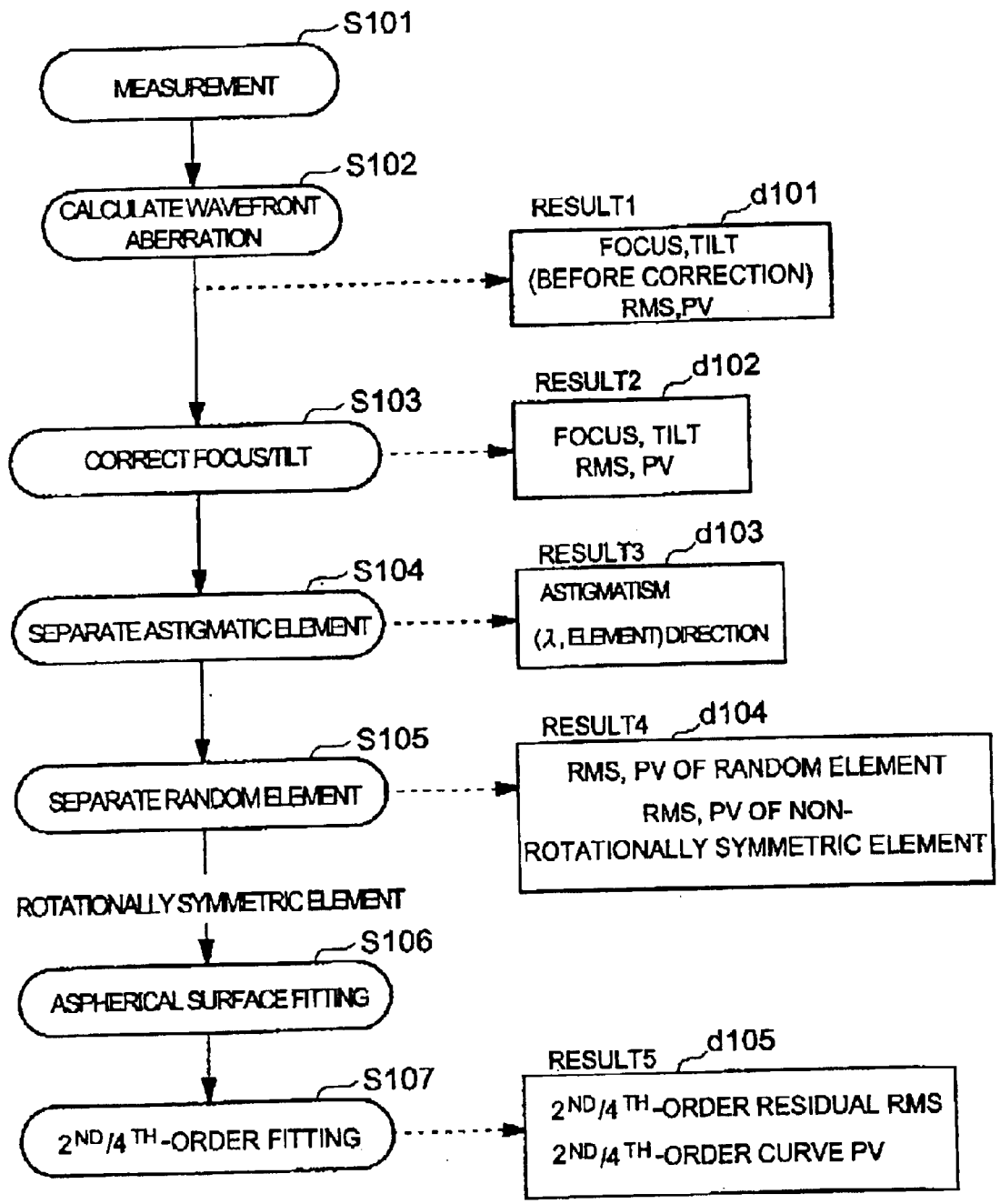

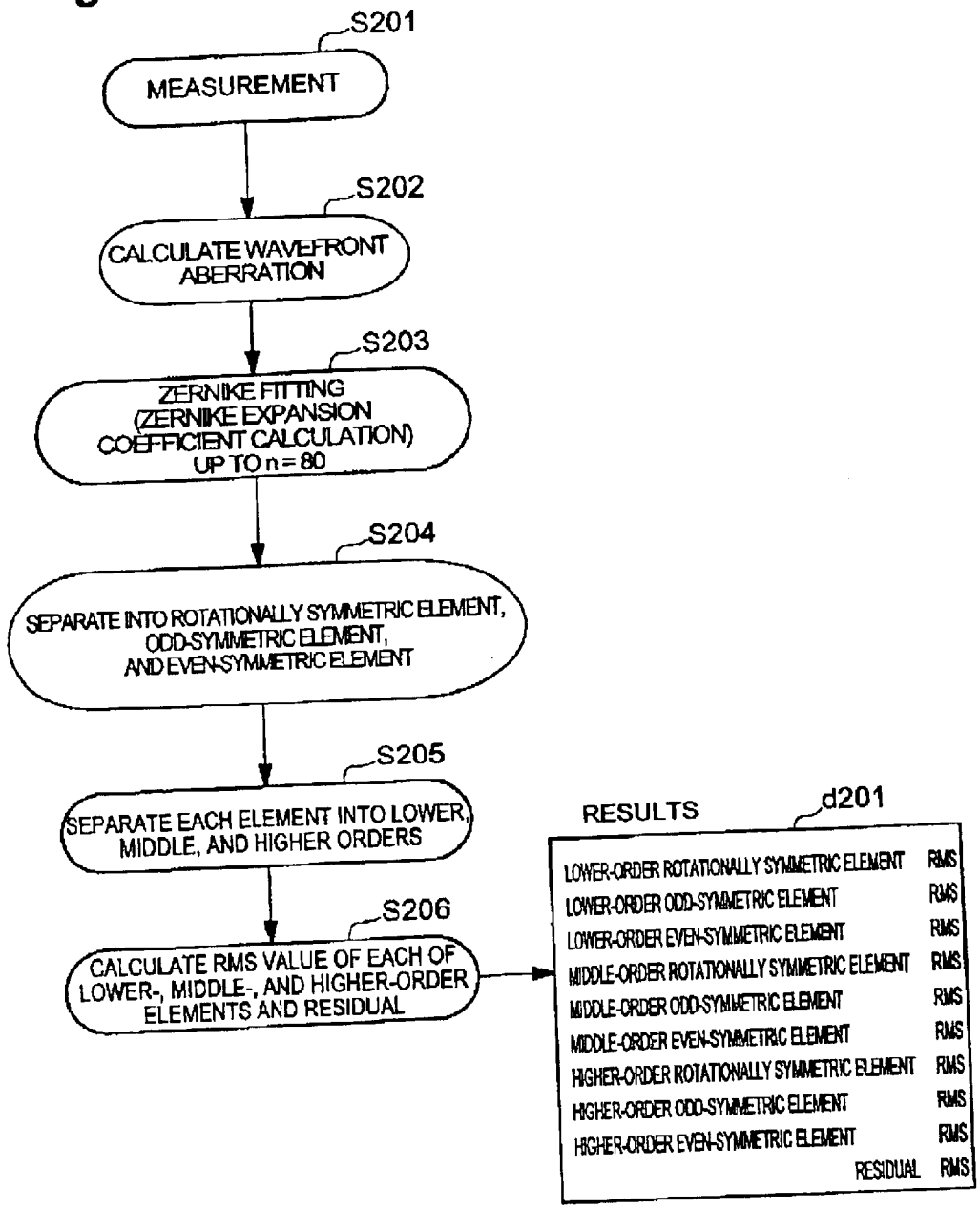

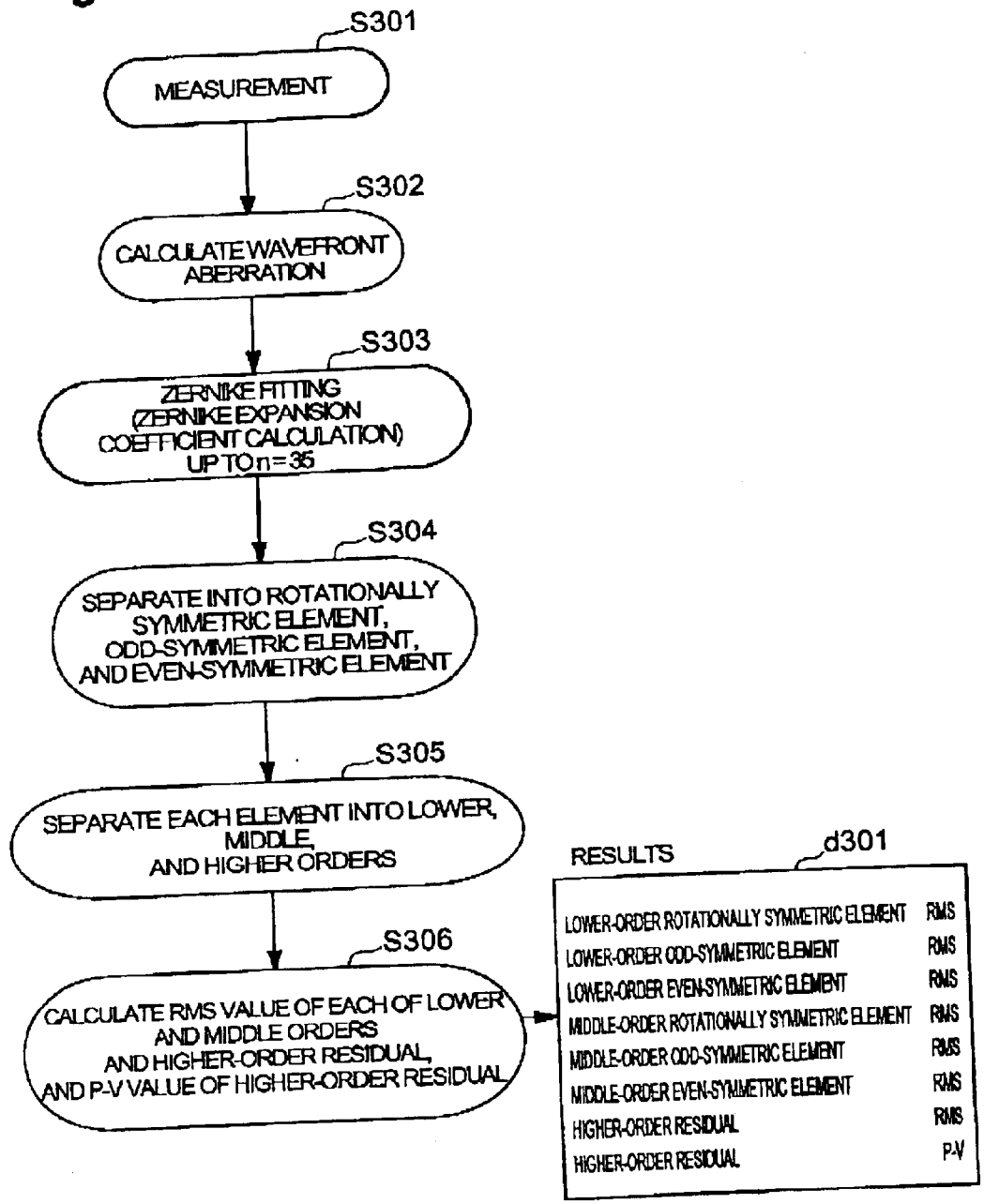

OPTICAL MEMBER FOR PHOTOLITHOGRAPHY AND METHOD OF EVALUATING THE SAME

TECHNICAL FIELD

The present invention relates to an optical member for photolithography, employed as an optical device such as a lens, prism, mirror, correction plate, or photomask for light in a specific wavelength region at 250 nm or shorter, preferably 200 nm or shorter, in the UV lithography technology in particular; and a method of evaluating the same.

BACKGROUND ART

In photolithography exposure apparatus for making semiconductor devices such as LSI, liquid crystal display devices, thin-film magnetic heads, or the like, a pattern on a projection original such as a mask or reticle is irradiated with light from a light source by way of an illumination optical system, and the pattern is projected by way of a projection optical system onto a photosensitive substrate such as a wafer or glass plate coated with photoresist beforehand, so as to carry out exposure. Types of the projection optical system include refraction type projection optical systems constituted by lenses adapted to transmit/refract light at an exposure wavelength, reflection type projection optical systems constituted by mirrors adapted to reflect light at the exposure wavelength, and catadioptric projection optical systems combining lenses and mirrors.

In recent years, as the degree of integration has been advancing in semiconductor devices and the like, patterns transferred onto a substrate have been becoming finer. Therefore, photolithography exposure apparatus have been shifting their light sources from i-line (365 nm) to KrF excimer laser (248 nm) and ArF excimer laser (193 nm), and further to $F_2$ laser (157 nm), thus attaining shorter wavelengths. As a consequence, higher optical performances have been required for optical systems for the photolithography exposure apparatus. In particular, projection optical systems for transferring fine mask patterns onto photosensitive surfaces of wafers have been demanded to exhibit quite high optical performances with a high resolution and nearly zero aberrations. For satisfying such a demand, a very high level has been required for the refractive index homogeneity of optical members such as lenses, prisms, mirrors, and photomasks used as optical systems in photolithography exposure apparatus (hereinafter referred to as optical members for photolithography).

Meanwhile, it is important that optical members for photolithography exhibit no unevenness in their refractive index (i.e., have refractive index homogeneity). Conventionally, the refractive index homogeneity of an optical member for photolithography has been evaluated by measuring the wavefront aberration occurring when light passes through the optical member, and using the difference between the maximum and minimum values (here in after referred to as PV value), root mean square (hereinafter referred to as RMS value), or the like of the wavefront aberration as an evaluation index. Specifically, optical members have been thought superior as their PV and RMS values are smaller. Namely, in order to lower these values, optical members considered to be of high quality have been made.

Japanese Patent Application Laid-Open No. HEI 8-5505 discloses a conventional refractive index homogeneity evaluating method. A specific procedure of this method will be explained with reference to FIG. 1.

(1) An optical member for photolithography ground into a columnar or prismatic (rectangular parallelepiped) shape is set to an interferometer, and a reference wavefront is perpendicularly emitted to thus ground surface, so as to measure wavefront aberration (S101). Information resulting from the refractive index distribution of the optical member appears in thus measured wavefront aberration (S102, d101). In this information, an aberration error resulting from a curvature component is referred to as a power element or focus element, whereas that resulting from a tilt component is referred to as a tilt element.

(2) The power and tilt elements are eliminated from the measured wavefront aberration (S103, d102).

(3) Further, the wavefront aberration resulting from the astigmatic element is eliminated (S104, d103).

(4) The remaining wavefront aberration is separated into a rotationally symmetric element and a non-rotationally symmetric (random) element (S105).

(5) The PV and RMS values of the non-rotationally symmetric (random) element are determined, and evaluation is carried out according to these values (d104).

(6) By a least-squares method, the rotationally symmetric element is fitted to an aspheric surface expression (S106), second- and fourth-order components are eliminated therefrom (S107), PV and RMS values of the remaining wavefront aberration components of sixth or higher even order (hereinafter referred to as second- and fourth-order residuals) are determined, and evaluation is carried out according to these values (d105).

As can be seen from the foregoing procedure, optical members having smaller non-rotationally symmetric (random) element and second- and fourth-order residuals have been considered optical members with a favorable refractive index homogeneity, and efforts have been made in order to make such optical members. Namely, optical members have been made heretofore so as to suppress the non-rotationally symmetric element and second- and fourth-order residuals to low levels.

However, optical systems constituted by optical members made so as to exhibit the same RMS and PV values of non-rotationally symmetric element and second- and fourth-order residuals have often yielded imaging performances different from each other. Also, there have been cases where a desirable imaging performance cannot be achieved even when using optical members which have been considered favorable according to the evaluation based on the above-mentioned RMS and PV values. It is needless to mention that semiconductor devices and the like with a high degree of integration are hard to make when using such an optical system failing to achieve a desirable imaging performance. In particular, large-size photolithography optical members exceeding a diameter of 250 mm and a thickness of 40 mm have been problematic in that the disadvantages mentioned above occur frequently when evaluated by the conventional method.

DISCLOSURE OF THE INVENTION

The inventors have found that, by applying a fitting method based on a Zernike cylindrical function system to the evaluation of refractive index homogeneity of individual optical members, the refractive index homogeneity of each optical member can be evaluated more accurately, whereby an optical system achieving a higher-level imaging performance can be constructed more reliably as compared with the case using a conventional refractive index homogeneity evaluating method. Namely, according to the present invention, a photolithography optical member having a high refractive index homogeneity and high quality can be provided more reliably, and not only a high-precision photolithography optical system but also a high-performance photolithography exposure apparatus can be made reliably with a high efficiency.

The present invention provides a method of evaluating a refractive index homogeneity of an optical member for photolithography, the method comprising:

a measurement step of transmitting light having a predetermined wavelength $\lambda$ through the optical member so as to measure a wavefront aberration;

a Zernike fitting step of expanding thus measured wavefront aberration into a polynomial of a Zernike cylindrical function system;

a first separating step of separating individual components of the polynomial into a rotationally symmetric element, an odd-symmetric element, and an even-symmetric element; and a second separating step of separating individual components of the polynomial into a plurality of parts according to a degree thereof.

In the evaluating method of the present invention, the step (first separating step) of separating individual components of the polynomial into the rotationally symmetric element, odd-symmetric element, and even-symmetric element, and the step (second separating step) of separating individual components of the polynomial into a plurality of parts according to the degree thereof may be carried out in any order.

Preferably, in the second separating step, individual components of the polynomial are separated into three parts of lower, middle, and higher orders according to the degree thereof. More preferably, the three parts of lower, middle, and higher orders are terms where n=4 to 8, n=9 to 35, and n>35 in the Zernike cylindrical function system, respectively, whereas a term where n=0 to 3 may be unused for evaluation.

Preferably, in the first and second separating steps is in accordance with the present invention, individual components of the polynomial are classified such that a rotationally symmetric element, an odd-symmetric element, and an even-symmetric element in a term where n=4 to 8 become a lower-order rotationally symmetric element, a lower-order odd-symmetric element, and a lower-order even-symmetric element, respectively; a rotationally symmetric element, an odd-symmetric element, and an even-symmetric element in a term where n=9 to 35 become a middle-order rotationally symmetric element, a middle-order odd-symmetric element, and a middle-order even-symmetric element, respectively; and a rotationally symmetric element, an odd-symmetric element, and an even-symmetric element in a term where n=36 to 80 become a higher-order rotationally symmetric element, a higher-order odd-symmetric element, and a higher-order even-symmetric element, respectively; and a term where n>80 becomes a residual in the polynomial; and the evaluating method in accordance with the present invention in this case preferably further comprises:

an RMS value calculating step of calculating an RMS value of each of the lower-order rotationally symmetric element, lower-order odd-symmetric element, lower-order even-symmetric element, middle-order rotationally symmetric element, middle-order odd-symmetric element, middle-order even-symmetric element, higher-order rotationally symmetric element, higher-order odd-symmetric element, higher-order even-symmetric element, and residual; and an evaluating step of evaluating whether thus calculated RMS value satisfies a predetermined condition or not.

The evaluating step preferably evaluates whether at least one of the following conditions $(a_1)$, $(b_1)$, $(c_1)$, and $(d_1)$ is satisfied or not:

$(a_1)$ each of the respective RMS values of the lower-order rotationally symmetric element, lower-order odd-symmetric element, and lower-order even-symmetric element is $0.06\lambda$ or less;

$(b_1)$ each of the respective RMS values of the middle-order rotationally symmetric element, middle-order odd-symmetric element, and middle-order even-symmetric element is $0.02\lambda$ or less;

$(c_1)$ each of the respective RMS values of the higher-order rotationally symmetric element, higher-order odd-symmetric element, and higher-order even-symmetric element is $0.005\lambda$ or less; and $(d_1)$ the RMS value of the residual is $0.006\lambda$ or less; and particularly preferably evaluates whether all of the above-mentioned conditions $(a_1)$, $(b_1)$, $(c_1)$, and $(d_1)$ are satisfied or not.

Further, the evaluating step preferably evaluates whether at least one of the following conditions $(a_2)$, $(b_2)$, $(c_2)$, and $(d_2)$ is satisfied or not:

$(a_2)$ each of the respective RMS values of the lower-order rotationally symmetric element, lower-order odd-symmetric element, and lower-order even-symmetric element is $0.02\lambda$ or less;

$(b_2)$ each of the respective RMS values of the middle-order rotationally symmetric element, middle-order odd-symmetric element, and middle-order even-symmetric element is $0.008\lambda$ or less;

$(c_2)$ each of the respective RMS values of the higher-order rotationally symmetric element, higher-order odd-symmetric element, and higher-order even-symmetric element is $0.003\lambda$ or less; and $(d_2)$ the RMS value of the residual is $0.004\lambda$ or less; and particularly preferably evaluates whether all of the above-mentioned conditions $(a_2)$, $(b_2)$, $(c_2)$, and $(d_2)$ are satisfied or not.

It is also preferred that, in the first and second separating steps in accordance with the present invention, individual components of the polynomial be classified such that a rotationally symmetric element, an odd-symmetric element, and an even-symmetric element in a term where n=4 to 8 become a lower-order rotationally symmetric element, a lower-order odd-symmetric element, and a lower-order even-symmetric element, respectively; a rotationally symmetric element, an odd-symmetric element, and an even-symmetric element in a term where n=9 to 35 become a middle-order rotationally symmetric element, a middle-order odd-symmetric element, and a middle-order even-symmetric element, respectively; and a term where n>35 becomes a higher-order residual in the polynomial; and the evaluating method in accordance with the present invention in this case preferably further comprises:

an RMS value calculating step of calculating an RMS value of each of the lower-order rotationally symmetric element, lower-order odd-symmetric element, lower-order even-symmetric element, middle-order rotationally symmetric element, middle-order odd-symmetric element, middle-order even-symmetric element, and higher-order residual; and an evaluating step of evaluating whether thus calculated RMS value satisfies a predetermined condition or not.

The evaluating step preferably evaluates whether at least one of the following conditions ($a_3$), ($b_3$), and ($c_3$) is satisfied or not:

($a_3$) each of the respective RMS values of the lower-order rotationally symmetric element, lower-order odd-symmetric element, and lower-order even-symmetric element is $0.06\lambda$ or less;

($b_3$) each of the respective RMS values of the middle-order rotationally symmetric element, middle-order odd-symmetric element, and middle-order even-symmetric element is $0.02\lambda$ or less; and ($c_3$) the RMS value of the higher-order residual is $0.01\lambda$ or less; and particularly preferably evaluates whether all of the above-mentioned conditions ($a_3$), ($b_3$), and ($c_3$) are satisfied or not.

Further, the evaluating step preferably evaluates whether at least one of the following conditions ($a_4$), ($b_4$), and ($c_4$) is satisfied or not:

($a_4$) each of the respective RMS values of the lower-order rotationally symmetric element, lower-order odd-symmetric element, and lower-order even-symmetric element is $0.02\lambda$ or less;

($b_4$) each of the respective RMS values of the middle-order rotationally symmetric element, middle-order odd-symmetric element, and middle-order even-symmetric element is $0.008\lambda$ or less; and ($c_4$) the RMS value of the higher-order residual is $0.004\lambda$ or less; and particularly preferably evaluates whether all of the above-mentioned conditions ($a_4$), ($b_4$), and ($c_4$) are satisfied or not.

Also, the present invention provides an optical member for photolithography used in a specific wavelength band at a wavelength of 250 nm or shorter;

wherein, while a wavefront aberration measured upon transmitting light having a wavelength $\lambda$ through the optical member is expanded into a polynomial of a Zernike cylindrical function system, a rotationally symmetric element, an odd-symmetric element, and an even-symmetric element in a term where n=4 to 8 are defined as a lower-order rotationally symmetric element, a lower-order odd-symmetric element, and a lower-order even-symmetric element, respectively; a rotationally symmetric element, an odd-symmetric element, and an even-symmetric element in a term where n=9 to 35 are defined as a middle-order rotationally symmetric element, a middle-order odd-symmetric element, and a middle-order even-symmetric element, respectively; and a rotationally symmetric element, an odd-symmetric element, and an even-symmetric element in a term where n=35 to 80 are defined as a higher-order rotationally symmetric element, a higher-order odd-symmetric element, and a higher-order even-symmetric element, respectively; and a term where n>80 is defined as a residual; the optical member satisfying at least one of the following conditions ($a_1$), ($b_1$), ($c_1$) and ($d_1$):

($a_1$) each of the respective RMS values of the lower-order rotationally symmetric element, lower-order odd-symmetric element, and lower-order even-symmetric element is $0.06\lambda$ or less;

($b_1$) each of the respective RMS values of the middle-order rotationally symmetric element, middle-order odd-symmetric element, and middle-order even-symmetric element is $0.02\lambda$ or less;

($c_1$) each of the respective RMS values of the higher-order rotationally symmetric element, higher-order odd-symmetric element, and higher-order even-symmetric element is $0.005\lambda$ or less; and ($d_1$) the RMS value of the residual is $0.006\lambda$ or less; and it is particularly preferable that the optical member satisfy all of the above-mentioned conditions ($a_1$), ($b_1$) ($c_1$), and ($d_1$).

Also, the optical member preferably satisfies at least one of the following conditions ($a_2$), ($b_2$), ($c_2$), and ($d_2$):

($a_2$) each of the respective RMS values of the lower-order rotationally symmetric element, lower-order odd-symmetric element, and lower-order even-symmetric element is $0.02\lambda$ or less;

($b_2$) each of the respective RMS values of the middle-order rotationally symmetric element, middle-order odd-symmetric element, and middle-order even-symmetric element is $0.008\lambda$ or less;

($c_2$) each of the respective RMS values of the higher-order rotationally symmetric element, higher-order odd-symmetric element, and higher-order even-symmetric element is $0.003\lambda$ or less; and ($d_2$) the RMS value of the residual is $0.004\lambda$ or less; and particularly preferably satisfies all of the above-mentioned conditions ($a_2$), ($b_2$), ($c_2$), and ($d_2$).

Further, the present invention provides an optical member for photolithography used in a specific wavelength band at a wavelength of 250 nm or shorter;

wherein, while a wavefront aberration measured upon transmitting light having a wavelength $\lambda$ through the optical member is expanded into a polynomial of a Zernike cylindrical function system, a rotationally symmetric element, an odd-symmetric element, and an even-symmetric element in a term where n=4 to 8 are defined as a lower-order rotationally symmetric element, a lower-order odd-symmetric element, and a lower-order even-symmetric element, respectively; a rotationally symmetric element, an odd-symmetric element, and an even-symmetric element in a term where n=9 to 35 are defined as a middle-order rotationally symmetric element, a middle-order odd-symmetric element, and a middle-order even-symmetric element, respectively; and a term where n>35 is defined as a higher-order residual; the optical member satisfying at least one of the following conditions ($a_3$) ($b_3$), and ($c_3$):

($a_3$) each of the respective RMS values of the lower-order rotationally symmetric element, lower-order odd-symmetric element, and lower-order even-symmetric element is $0.06\lambda$ or less;

($b_3$) each of the respective RMS values of the middle-order rotationally symmetric element, middle-order odd-symmetric element, and middle-order even-symmetric element is $0.02\lambda$ or less; and ($c_3$) the RMS value of the higher-order residual is $0.01\lambda$ or less; and particularly preferably satisfying all of the above-mentioned conditions ($a_3$), ($b_3$), and ($c_3$).

Also, the optical member preferably satisfies at least one of the following conditions ($a_4$), ($b_4$), and ($c_4$):

($a_4$) each of the respective RMS values of the lower-order rotationally symmetric element, lower-order odd-symmetric element, and lower-order even-symmetric element is $0.02\lambda$ or less;

($b_4$) each of the respective RMS values of the middle-order rotationally symmetric element, middle-order odd-symmetric element, and middle-order even-symmetric element is $0.008\lambda$ or less; and ($c_4$) the RMS value of the higher-order residual is $0.004\lambda$ or less; and particularly preferably satisfies all of the above-mentioned conditions ($a_4$), ($b_4$), and ($c_4$).

Also, the present invention provides a projection optical system employed in a photolithography exposure apparatus used in a specific wavelength band at a wavelength of 250 nm or shorter, wherein at least 90% of lenses constituting the projection optical system comprise the optical member in accordance with the present invention.

In the projection optical system of the present invention, it is particularly preferred that, in the above-mentioned lenses, a lens having a luminous flux diameter/effective diameter of ½ or less comprise an optical member satisfying all of the above-mentioned conditions ($a_2$), ($b_2$), ($c_2$), and ($d_2$) or an optical member satisfying all of the above-mentioned conditions ($a_4$), ($b_4$), and ($c_4$).

Further, the present invention provides a photolithography exposure apparatus used in a specific wavelength band at a wavelength of 250 nm or shorter, the exposure apparatus comprising the projection optical system of the present invention.

BRIEF DESCRIPTION OF THE DRAWINGS

FIG. 1 is a flowchart showing a method of evaluating the refractive index homogeneity of a photolithography optical member which has conventionally been carried out;

FIG. 2 is a flowchart showing a preferred embodiment of the method of evaluating the refractive index homogeneity of a photolithography optical member in accordance with the present invention;

FIG. 3 is a flowchart showing another preferred embodiment of the method of evaluating the refractive index homogeneity of a photolithography optical member in accordance with the present invention;

FIG. 7A is a schematic side view showing a state in which an optical member is measured in terms of wavefront while being rotated, whereas

FIG. 8A is a schematic side view showing a state in which an optical member is measured in terms of wavefront while being shifted sidewise, whereas

BEST MODES FOR CARRYING OUT THE INVENTION

Figure 4A:
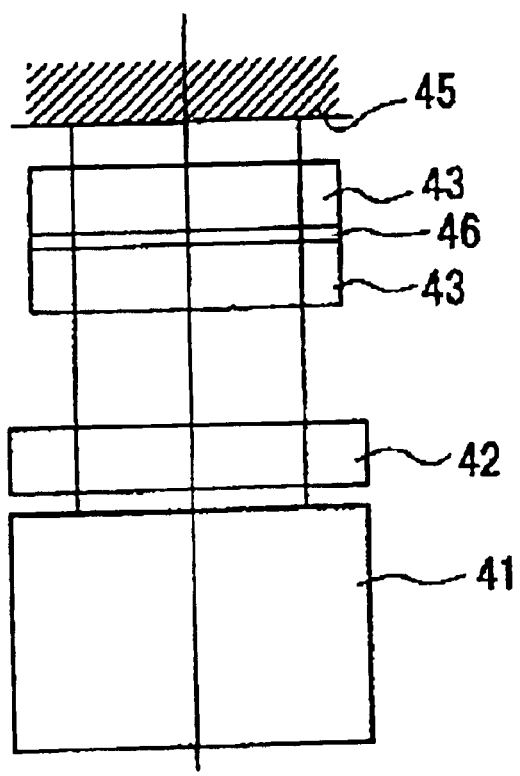
FIGS. 4A and 4B are schematic side views showing respective states in which an optical member is measured in terms of wavefront.

In the following, preferred embodiments of the present invention will be explained in detail with reference to the drawings when appropriate. In the drawings, parts identical or equivalent to each other will be referred to with numerals identical to each other.

First, materials are combined together, so as to synthesize an ingot. Employed as the materials are synthetic silica glass, fluorine-doped silica glass, calcium fluoride, barium fluoride, other crystal materials, and the like. Since synthesizing methods vary depending on the kinds of materials, they are synthesized by methods suitable for the individual materials. A photolithography optical member is cut out from thus synthesized ingot. The optical member has a diameter of 300 mm and a thickness of 60 mm, for example, whereas its upper and lower faces are subjected to high-precision polishing or grinding.

The wavefront aberration of the optical member is measured, for example, by a Fizeau type interferometer, using an He—Ne laser at a wavelength of 633 nm as a light source, for measuring flat optical members. This interferometer has a structure capable of fixing an object to be measured between two plane-parallel plate members. Though light sources employed for wavefront aberration measurement more fundamentally use KrF excimer lasers (248 nm) or ArF excimer lasers (193 nm), the He—Ne lasers are often used due to such reasons as the cost, size, and measurement stability of the interferometer.

The measurement of wavefront aberration is carried out by an oil-on-plate method. This method will be explained specifically with reference to the flowcharts of FIGS. 2 and 3, and explanatory views of FIGS. 4A and 4B.

Figure 4B:
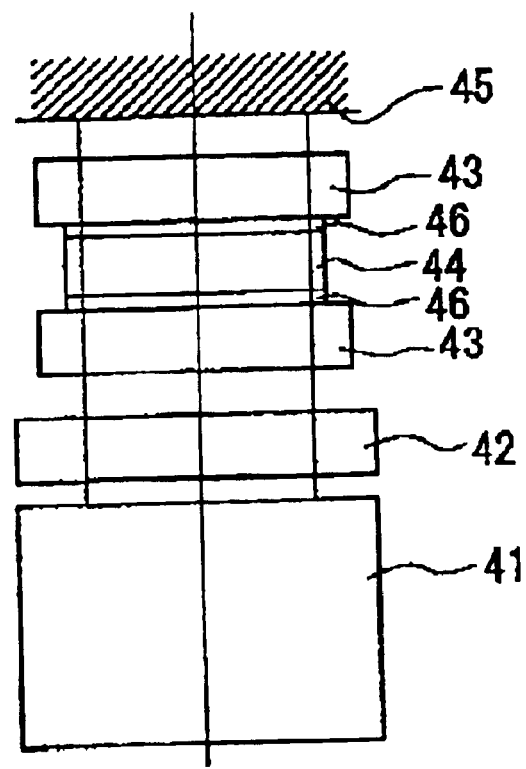

First, an interferometer is prepared. As shown in FIGS. 4A and 4B, the interferometer comprises a body part 41, a reference surface object 42, two plane-parallel plate members 43, and a reflecting surface 45. Before setting an optical member 44, which is an object to be measured, to this interferometer, the gap between the two plane-parallel plate members 43 is filled with a transparent oil 46 having a refractive index identical to that of the object to be measured and is irradiated in this state with a reference wavefront formed by a laser beam, whereas the light transmitted therethrough is captured, so as to obtain wavefront data (S201, S301). This state is shown in FIG. 4A. Subsequently, in the state where the optical member 44 is set between the two plane-parallel plate members 43, the gaps between the plane-parallel plate members 43 and the optical member 44 are filled with the transparent oil 46, and the light transmitted therethrough is captured in this state, so as to obtain wavefront data. This state is shown in FIG. 4B.

Then, the wavefront data measured in the state setting no optical member is subtracted from the wavefront data measured in the state setting the optical member 44. This eliminates not only the influence of measurement errors due to the wavefront aberration caused by the surface form of the optical member 44, but also errors due to the wavefront aberration caused by the interferometer, whereby the wavefront aberration within the optical member 44 can be measured alone. Namely, the wavefront aberration inherent in the optical member can be determined (S202, S302).

Preferably, in the case where the cross section is circular, a square area circumscribing this circle is divided into about 50×50 mesh or more, and the measurement value of each of thus divided elements is obtained. The number of elements (number of measurement points) is preferably changed according to the diameter of the object to be measured, and is more preferably determined according to the luminous flux diameter (partial diameter). For example, while the luminous flux transmitted through a reticle R in the optical system (projection optical system) shown in FIG. 5 passes through lens groups G1 to G6, so as to be focused on a surface of a wafer W, the respective luminous flux diameters (partial diameters) transmitted through the individual lenses vary. Namely, the luminous flux diameter in lenses closer to the reticle R is smaller than that in lenses farther from the reticle R (closer to the wafer W). Respective optical members for processing individual lenses can be measured at substantially the same accuracy when the number of measurement points is selected so as to become substantially identical within the luminous flux diameters of the lenses. Here, the number of measurement points becomes very large when measuring the whole effective lens diameter of an optical member used for a lens having a small luminous flux with respect to the effective diameter. In this case, the wavefront aberration measurement may be carried out for each of a plurality of regions in the optical member, and thus obtained wavefront aberration data may be combined together, whereby the wavefront aberration of the whole optical member can be obtained.

For the wavefront aberration measurement, Twyman-Green type interferometers, shearing type interferometers, and the like may be used as well.

Figure 6:
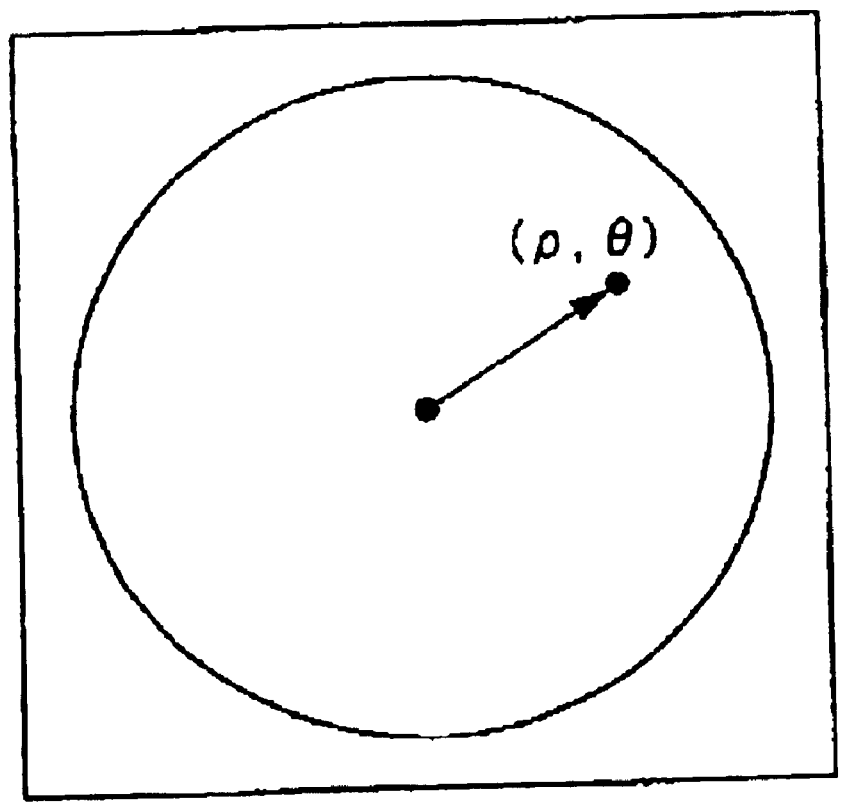
FIG. 6 is a schematic plan view for explaining a coordinate system representing measured wavefront aberration data.

As shown in FIG. 6, a coordinate system is defined on the exit pupil surface of the optical member, so as to represent the measured wavefront aberration. Namely, polar coordinates are defined on the exit pupil surface, and the wavefront aberration W is represented as $$W(\rho,\theta).$$

Further, it is expanded into an orthogonal function system. In the present invention, for separating the wavefront aberration into a rotationally symmetric element, an odd-symmetric element, and an even-symmetric element about the pupil of the optical member, polar coordinates are used as a coordinate system, and a Zernike cylindrical function is used as an orthogonal function system. Here, $\rho$ is the normalized pupil radius taking the radius of exit pupil as 1, and $\theta$ is the directional angle of radius vector in polar coordinates. Namely, using a Zernike cylindrical function system $Zn(\rho,\theta)$, wavefront aberration $W(\rho,\theta)$ is expanded as $$W(\rho,\theta)=\Sigma C n Z n(\rho,\theta) \tag{1}$$

(S203, S303). Here, Cn is the expansion coefficient. Fitting can be effected with a higher accuracy as the expansion reaches a greater n value. However, it is desirable for n to be of an appropriate dimension since the burden on calculation will be heavier if n is too large. From such a viewpoint, it will be suitable if n=0 to 35 or n=0 to 80. Fitting up to the 10th-order coefficient is possible when n=0 to 35, whereas fitting up to the 16th-order coefficient is possible when n=0 to 80.

For example, a Zernike cylindrical function system $Zn(\rho,\theta)$ in the case where n=0 to 35 is as follows:

n: $Zn(\rho,\theta)$
0: 1
1: $\rho \cos \theta$
2: $\rho \sin \theta$
3: $2\rho^2-1$
4: $\rho^2 \cos 2\theta$
5: $\rho^2 \sin 2\theta$
6: $(3\rho^2-2)\rho \cos \theta$
7: $(3\rho^2-2)\rho \sin \theta$
8: $6\rho^4-6\rho^2+1$
9: $\rho^3 \cos 3\theta$
10: $\rho^3 \sin 3\theta$
11: $(4\rho^2-3)\rho^2 \cos 2\theta$
12: $(4\rho^2-3)\rho^2 \sin 2\theta$
13: $(10\rho^4-12\rho^2+3)\rho \cos \theta$
14: $(10\rho^4-12\rho^2+3)\rho \sin \theta$
15: $20\rho^6-30\rho^4+12\rho^2-1$
16: $\rho^4 \cos 4\theta$
17: $\rho^4 \sin 4\theta$
18: $(5\rho^2-4)\rho^3 \cos 3\theta$
19: $(5\rho^2-4)\rho^3 \sin 3\theta$
20: $(15\rho^4-20\rho^2+6)\rho^2 \cos 2\theta$
21: $(15\rho^4-20\rho^2+6)\rho^2 \sin 2\theta$
22: $(35\rho^6-60\rho^4+\rho^2-4)\rho \cos \theta$
23: $(35\rho^6-60\rho^4+\rho^2-4)\rho \sin \theta$
24: $70\rho^8-140\rho^6+90\rho^4-20\rho^2+1$
25: $\rho^5 \cos 5\theta$
26: $\rho^5 \sin 5\theta$
27: $(6\rho^2-5)\rho^4 \cos 4\theta$
28: $(6\rho^2-5)\rho^4 \sin 4\theta$
29: $(21\rho^4-30\rho^2+10)\rho^3 \cos 3\theta$
30: $(21\rho^4-30\rho^2+10)\rho^3 \sin 3\theta$
31: $(56\rho^6-104\rho^4+60\rho^2-10)\rho^2 \cos 2\theta$
32: $(56\rho^6-104\rho^4+60\rho^2-10)\rho^2 \sin 2\theta$
33: $(126\rho^8-280\rho^6+210\rho^4-60\rho^2+5)\rho \cos \theta$
34: $(126\rho^8-280\rho^6+210\rho^4-60\rho^2+5)\rho \sin \theta$
35: $252\rho^{10}-630\rho^8+560\rho^6-210\rho^4+30\rho^2-1$ Zernike cylindrical function systems $Zn(\rho,\theta)$ in the case where n=36 and greater will not be explained here.

Subsequently, the individual terms of expression (1) are separated into the following three kinds (S204, S304):

(a) terms not including $\theta$, i.e., a rotationally symmetric element in which a value on a certain set of coordinates and a value on a set of coordinates obtained when the former coordinates are rotated by a given angle about the center of pupil equal each other;

(b) terms including trigonometric functions of odd multiples of the directional angle of radius vector $\theta$ such as sin(or cos)$\theta$ and sin(or cos)$3\theta$, i.e., an odd-symmetric element in which a value on a certain set of coordinates and a value on a set of coordinates obtained when the former coordinates are rotated by odd submultiples of 360° about the center of pupil equal each other; and (c) terms including trigonometric functions of even multiples of the directional angle of radius vector $\theta$ such as sin(or cos)$2\theta$ and sin (or cos)$4\theta$, i.e., an even-symmetric element in which a value on a certain set of coordinates and a value on a set of coordinates obtained when the former coordinates are rotated by even submultiples of 360° about the center of pupil equal each other. Namely, letting $W_{rot}$, $W_{odd}$, and $W_{evn}$ be the rotationally symmetric element, odd-symmetric element, and even-symmetric element of wavefront aberration, $$W_{rot}(\rho,\theta)=C_0+C_3Z_3+C_8Z_8+C_{15}Z_{15}+C_{24}Z_{24}+\ldots, \tag{2}$$

$$W_{odd}(\rho,\theta)=C_1Z_1+C_2Z_2+C_6Z_6C_7Z_7+C_9Z_9+C_{10}Z_{10}\ldots, \tag{3}$$

and $$W_{evn}(\rho,\theta)=C_4Z_4+C_5Z_5+C_{11}Z_{11}+C_{12}Z_{12}+C_{16}Z_{16}+\ldots, \tag{4},$$

Further, let $r_w$ be the RMS value (root mean square) of the wavefront aberration in expression (1), $r_{rot}$ be the RMS value of the rotationally symmetric element $W_{rot}$ of wavefront aberration in expression (2), $r_{odd}$ be the RMS value of the odd-symmetric element $W_{odd}$ of wavefront aberration in expression (3), and $r_{evn}$ be the RMS value of the even-symmetric element $W_{evn}$ of wavefront aberration in expression (4). Among $r_w$, $r_{rot}$, $r_{odd}$, and $r_{evn}$, the relationship of $(r_w)^2=(r_{rot})^2+(r_{odd})^2+(r_{evn})^2$ holds.

$r_{rot}$, $r_{odd}$, and $r_{evn}$ can be related to the spherical aberration element, coma aberration element, and astigmatism aberration element in the refractive index distribution of the optical member, respectively.

A case where optical members are processed into lenses, which are then combined together to construct an optical system will be considered here. The aberration of elements having a relatively small n value, i.e., elements having a relatively low degree, is easy to decrease by changing the lens gaps, rotating some of the lenses about the optical axis, tilting them, or shifting them. Aberration elements having a greater degree of n are harder to decrease, but can be reduced to some extent by rotating the lenses or changing the combination of lenses. When not reduced by such a method, aberration elements can be reduced by modifying surface forms of some lenses. However, aberration elements having a further greater degree of n are hard to decrease.

According to the inventors' studies, the aberration can be eliminated in elements having a smaller n value, e.g., elements in which n=0 to 3, so that there are no problems even when these elements are excluded from objects to be evaluated. When elements whose n is 4 or greater are divided into a plurality of regions according to the dimension of n and their aberration elements are evaluated, the refractive index homogeneity of the optical member can be evaluated reasonably. For example, when the components are divided into three regions such that elements whose n=4 to 8 are defined as a lower order, elements whose n=9 to 35 are defined as a middle order, and elements whose n>35 are defined as a higher order, and then evaluation of aberration elements is carried out, the refractive index homogeneity of the optical member can be evaluated reasonably (S205, S305).

Then, when each of $W_{rot}$, $W_{odd}$, and $W_{evn}$ is divided into a lower order (n=4 to 8), a middle order (n=9 to 35), and a higher order (n>35), they can be written from expressions (2), (3), and (4) as follows:

$$\text{lower-order } W_{rot}(\rho,\theta) = C_8 Z_8 \quad (5)$$

$$\text{lower-order } W_{odd}(\rho,\theta) = C_6 Z_6 + C_7 Z_7 \quad (6)$$

$$\text{lower-order } W_{evn}(\rho,\theta) = C_4 Z_4 + C_5 Z_5 \quad (7)$$

$$\text{middle-order } W_{rot}(\rho,\theta) = C_{15} Z_{15} + C_{24} Z_{24} + C_{35} Z_{35} \quad (8)$$

$$\text{middle-order } W_{odd}(\rho,\theta) = C_9 Z_9 + C_{10} Z_{10} + C_{13} Z_{13} + C_{14} Z_{14} + C_{18} Z_{18}$$
$$+ C_{19} Z_{19} + C_{22} Z_{22} + C_{23} Z_{23} + C_{25} Z_{25} + C_{26} Z_{26} + C_{29} Z_{29} + C_{30} Z_{30} + C_{33} Z_{33} + C_{34} Z_{34} \quad (9)$$

$$\text{middle-order } W_{evn}(\rho,\theta) = C_{11} Z_{11} + C_{12} Z_{12} + C_{16} Z_{16} + C_{17} Z_{17} + C_{20} Z_{20} + C_{21} Z_{21} + C_{27} Z_{27} + C_{28} Z_{28} + C_{31} Z_{31} + C_{32} Z_{32} \quad (10)$$

$$\text{higher-order } W_{rot}(\rho,\theta) = C_{35} Z_{35} + C_{48} Z_{48} + C_{63} Z_{63} + C_{80} Z_{80}$$

$$\text{higher-order } W_{odd}(\rho,\theta) = C_{38} Z_{38} + C_{39} Z_{39} + C_{42} Z_{42} + C_{43} Z_{43} + C_{46} Z_{46} + C_{47} Z_{47} + C_{49} Z_{49} + C_{50} Z_{50} + C_{53} Z_{53} + C_{54} Z_{54} + C_{57} Z_{57} + C_{58} Z_{58} + C_{61} Z_{61}$$

$$+ C_{62} Z_{62} + C_{66} Z_{66} + C_{67} Z_{67} + C_{70} Z_{70} + C_{71} Z_{71} + C_{74} Z_{74} + C_{75} Z_{75} + C_{78} Z_{78} + C_{79} Z_{79} \quad (12)$$

$$\text{higher-order } W_{evn}(\rho,\theta) = C_{36} Z_{36} + C_{37} Z_{37} + C_{40} Z_{40} + C_{41} Z_{41} + C_{44} Z_{44} + C_{45} Z_{45} + C_{51} Z_{51} + C_{52} Z_{52} + C_{55} Z_{55} + C_{56} Z_{56} + C_{59} Z_{59} + C_{60} Z_{60} + C_{64} Z_{64}$$

$$+ C_{65} Z_{65} + C_{68} Z_{68} + C_{69} Z_{69} + C_{72} Z_{72} + C_{73} Z_{73} + C_{76} Z_{76} + C_{77} Z_{77} \quad (13)$$

Then, the respective RMS values of these wavefront aberration elements are defined as lower-order $r_{rot}$, lower-order $r_{odd}$, lower-order $r_{evn}$, middle-order $r_{rot}$, middle-order $r_{odd}$, middle-order $r_{evn}$, higher-order $r_{rot}$, higher-order $r_{odd}$, and higher-order $r_{evn}$, whereas the wavefront aberration element left unfitted is defined as a residual. Also, the RMS and PV values of the residual are defined as the residual RMS and residual PV, respectively (S206->d201).

When fitted while n=0 to 35, the higher-order $r_{rot}$, higher-order $r_{odd}$, and higher-order $r_{evn}$, are not defined, whereas the wavefront aberration element left unfitted in the lower- and middle-order terms is defined as a higher-order residual. Then, the RMS and PV values of the higher-order residual are defined as higher-order residual RMS and higher-order residual PV, respectively (S306->d301).

Though the wavefront aberration is initially separated into a rotationally symmetric element, an odd rotationally symmetric element, and an even rotationally symmetric element, and then each element is separated into lower, middle, and higher orders according to the degree thereof here, this order maybe reversed as a matter of course. Namely, totally the same results are obtained when the wavefront aberration is initially separated into lower-, middle-, and higher-order elements according to the degree thereof and then each element is separated into a rotationally symmetric element, an odd rotationally symmetric element, and an even rotationally symmetric element.

The inventors made optical members having various characteristics in terms of the refractive index homogeneity, classified them according to their refractive index homogeneity levels, constructed photolithography projection optical systems by combining the optical members at their respective levels, and evaluated their optical performances.

As a result, it has been found that, letting $\lambda$ be the wavelength of the light source, optical members whose lower-order $r_{rot}$ is $0.06\lambda$ or less, lower-order $r_{odd}$ is $0.06\lambda$ or less, and lower-order $r_{evn}$ is $0.06\lambda$ or less, or middle-order $r_{rot}$ is $0.02\lambda$ or less, middle-order $r_{odd}$ is $0.02\lambda$ or less, and middle-order $r_{evn}$ is $0.02\lambda$ or less, or higher-order $r_{rot}$ is $0.005\lambda$ or less, higher-order $r_{odd}$ is $0.005\lambda$ or less, and higher-order $r_{evn}$ is $0.005\lambda$ or less, or residual RMS is $0.006\lambda$ or less can yield favorable optical performances for photolithography.

It has also been found that optical members whose lower-order $r_{rot}$ is $0.02\lambda$ or less, lower-order $r_{odd}$ is $0.02\lambda$ or less, and lower-order $r_{evn}$ is $0.02\lambda$ or less, or middle-order $r_{rot}$ is $0.008\lambda$ or less, middle-order $r_{odd}$ is $0.008\lambda$ or less, and middle-order $r_{evn}$ is $0.008\lambda$ or less, or higher-order $r_{rot}$ is $0.003\lambda$ or less, higher-order $r_{odd}$ is $0.003\lambda$ or less, and higher-order $r_{evn}$ is $0.003\lambda$ or less, or residual RMS is $0.004\lambda$ or less can yield more favorable optical performances for photolithography and are particularly preferable as optical members for projection optical systems.

It has also been found that optical members whose lower-order $r_{rot}$ is $0.06\lambda$ or less, lower-order $r_{odd}$ is $0.06\lambda$ or less, and lower-order $r_{evn}$ is $0.06\lambda$ or less, and middle-order $r_{rot}$ is $0.02\lambda$ or less, middle-order $r_{odd}$ is $0.02\lambda$ or less, and middle-order $r_{evn}$ is $0.02\lambda$ or less, and higher-order $r_{rot}$ is $0.005\lambda$ or less, higher-order $r_{odd}$ is $0.005\lambda$ or less, and higher-order $r_{evn}$ is $0.005\lambda$ or less, and residual RMS is $0.006\lambda$ or less can yield further favorable optical performances for photolithography.

It has also been found that optical members whose lower-order $r_{rot}$ is $0.02\lambda$ or less, lower-order $r_{odd}$ is $0.02\lambda$ or less, and lower-order $r_{evn}$ is $0.02\lambda$ or less, and middle-order $r_{rot}$ is $0.008\lambda$ or less, middle-order $r_{odd}$ is $0.008\lambda$ or less, and middle-order $r_{evn}$ is $0.008\lambda$ or less, and higher-order $r_{rot}$ is $0.003\lambda$ or less, higher-order $r_{odd}$ is $0.003\lambda$ or less, and higher-order $r_{evn}$ is $0.003\lambda$ or less, and residual RMS is $0.004\lambda$ or less can yield further favorable optical performances for photolithography and are particularly preferable as optical members for projection optical systems.

It has also been found that, when fitted while n=0 to 35, optical members whose lower-order $r_{rot}$ is $0.06\lambda$ or less, lower-order $r_{odd}$ is $0.06\lambda$ or less, and lower-order $r_{evn}$ is $0.06\lambda$ or less, or middle-order $r_{rot}$ is $0.02\lambda$ or less, middle-order $r_{odd}$ is $0.02\lambda$ or less, and middle-order $r_{evn}$ is $0.02\lambda$ or less, or higher-order residual RMS is 0.01λ or less can yield favorable optical performances for photolithography and are usable as optical members for projection optical systems.

It has also been found that optical members whose lower-order $r_{rot}$ is 0.02λ or less, lower-order $r_{odd}$ is 0.02λ or less, and lower-order $r_{evn}$ is 0.02λ or less, or middle-order $r_{rot}$ is 0.008λ or less, middle-order $r_{odd}$ is 0.008λ or less, and middle-order $r_{evn}$ is 0.008λ or less, or higher-order residual RMS is 0.004λ or less can yield favorable optical performances for photolithography and are particularly preferable as optical members for projection optical systems.

It has also been found that optical members whose lower-order $r_{rot}$ is 0.06λ or less, lower-order $r_{odd}$ is 0.06λ or less, and lower-order $r_{evn}$ is 0.06λ or less, and middle-order $r_{rot}$ is 0.02λ or less, middle-order $r_{odd}$ is 0.02λ or less, and middle-order $r_{evn}$ is 0.02λ or less, and higher-order residual RMS is 0.01λ or less can yield more favorable optical performances for photolithography.

It has also been found that optical members whose lower-order $r_{rot}$ is 0.02λ or less, lower-order $r_{odd}$ is 0.02λ or less, and lower-order $r_{evn}$ is 0.02λ or less, and middle-order $r_{rot}$ is 0.008λ or less, middle-order $r_{odd}$ is 0.008λ or less, and middle-order $r_{evn}$ is 0.008λ or less, and higher-order residual RMS is 0.004λ or less can yield further favorable optical performances for photolithography and are particularly preferable as optical members for projection optical systems.

Figure 5:
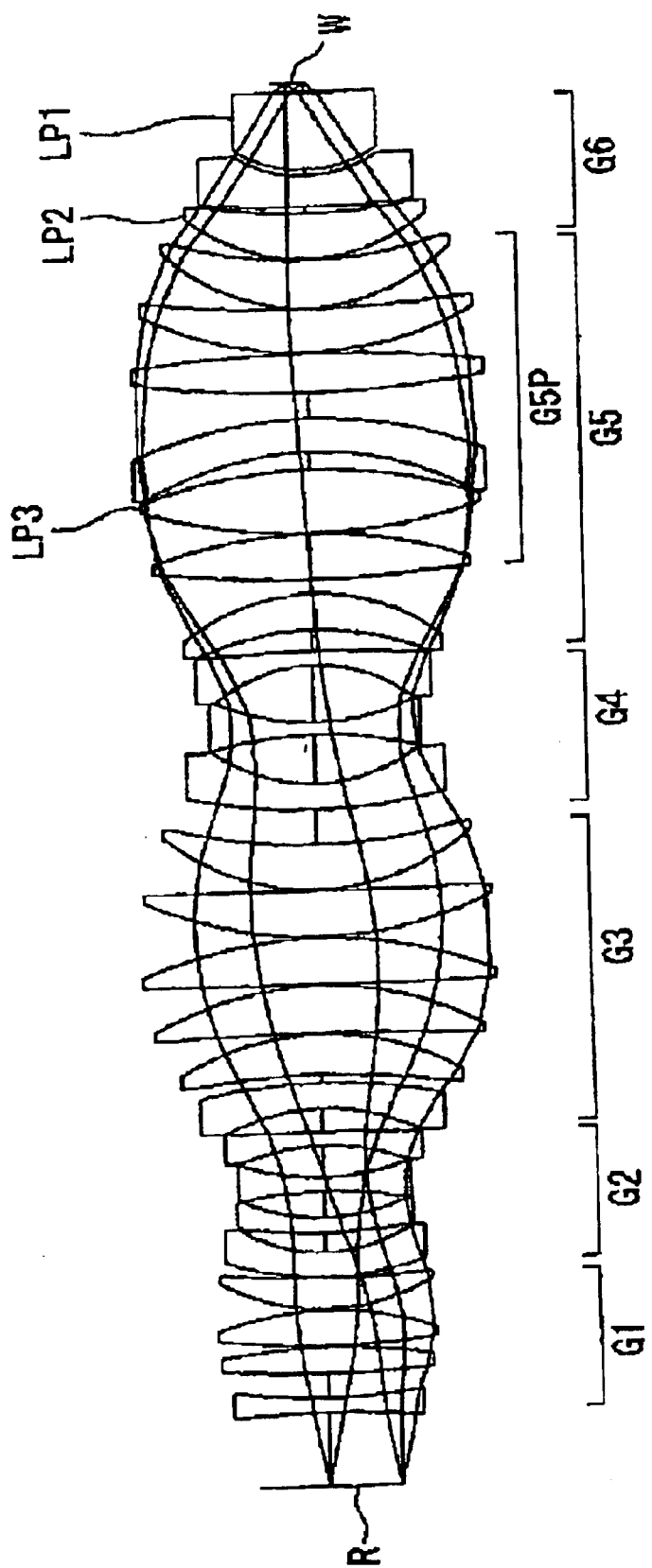
FIG. 5 is a schematic sectional view showing an embodiment of a projection optical system for an excimer laser stepper.

Here, a projection optical system employed in a photolithography exposure apparatus will be explained with reference to FIG. 5. A luminous flux transmitted through a reticle R passes through a plurality of lens groups G1 to G6, so as to be focused onto a surface of a wafer W. While the unevenness in refractive index of each lens adversely affects the imaging performance on the wafer surface, its magnitude varies depending on the degree of elements. Namely, the lower-, middle-, and higher-order elements tend to increase their influence on the imaging performance successively in this order. The reason therefor will be explained in the following. First, means for correcting wavefront components as an optical system include adjustment of lens gaps, rotating/shifting/tilting of lenses, and the like for the lower-order element; moderate aspheric surface processing of lens surfaces, compressing of lenses from two directions, application of pressure between lenses, and the like for the middle-order element; and complicated aspheric surface processing of lens surfaces, compressing of lenses from a multitude of directions, and the like for the higher-order element. Means for processing lens surfaces into complicated aspheric surfaces include, for example, fine processing of lens surfaces by grinding with small-size grinding tools or magnetic fluids, ion beam irradiation, CVM (Chemical Vapor Milling), and the like. These means become successively harder to attain for lower, middle, and higher orders. This is the reason why the lower-, middle-, and higher-order elements successively increase their influence on imaging performances in this order.

Namely, the importance of evaluation is the highest in the higher-order element, and successively decreases in the middle- and lower-order elements. Therefore, while it is the most desirable that all of the lower-, middle-, and higher-order elements be evaluated, the aimed object will be achieved to a certain extent if only the higher-order element or only the higher- and middle-order elements are evaluated.

On the other hand, the influence of the higher-order element on the imaging performance is not the same among the lenses. When the luminous flux diameter (partial diameter) is taken into consideration in FIG. 5, it can be seen that the luminous flux diameter of a lens closer to the reticle R is smaller than that of a lens farther from the reticle R (closer to the wafer W). Therefore, the magnitude of adverse affect of the unevenness in refractive index with in a lens upon the imaging performance on the wafer is much greater in a lens closer to the reticle than in a lens farther from the reticle. In particular, this influence is greater in lenses whose value of luminous flux diameter/effective diameter is less than ½. Therefore, lenses having a luminous flux diameter/effective diameter value smaller than ½ (located closer to the reticle R) can yield a further favorable imaging performance if an optical member having a smaller higher-order element RMS is used therefor.

Hence, it is preferred that at least 90% of the lenses constituting the projection optical system comprise the optical member of the present invention, and it is more preferable that all the lenses comprise the optical member of the present invention.

Preferably at least 90% of the lenses having a luminous flux diameter/effective diameter of ½ or less in the lenses constituting the projection optical system comprise an optical member whose lower-order $r_{rot}$ is 0.02λ or less, lower-order $r_{odd}$ is 0.02λ or less, and lower-order $r_{evn}$ is 0.02λ or less, and middle-order $r_{rot}$ is 0.008λ or less, middle-order $r_{odd}$ is 0.008λ or less, and middle-order $r_{evn}$ is 0.008λ or less, and higher-order $r_{rot}$ is 0.003λ or less, higher-order $r_{odd}$ is 0.003λ or less, and higher-order $r_{evn}$ is 0.003λ or less, and residual RMS is 0.004λ or less; and more preferably all the lenses comprise an optical member satisfying the condition mentioned above. Preferably at least 90% of the lenses having a luminous flux diameter/effective diameter of ½ or less in the lenses constituting the projection optical system comprise an optical member whose lower-order $r_{rot}$ is 0.02λ or less, lower-order $r_{odd}$ is 0.02λ or less, and lower-order $r_{evn}$ is 0.02λ or less, and middle-order $r_{rot}$ is 0.008λ or less, middle-order $r_{odd}$ is 0.008λ or less, and middle-order $r_{evn}$ is 0.008λ or less, and higher-order residual RMS is 0.004λ or less; and particularly preferably all the lenses comprise an optical member satisfying the condition mentioned above.

As explained above, the oil-on-plate method is a measurement method in which the wavefront aberration measured in a state without setting an object to be measured is subtracted from the wavefront aberration measured in a state setting the object, so as to eliminate not only the influence of wavefront aberration caused by the wavefront aberration due to the surface form of the object but also the part of wavefront aberration caused by the interferometer, whereby the wavefront aberration within the object can be measured alone. Namely, letting W be the wavefront aberration depending on the inner homogeneity of an optical member as the object to be measured, E be the wavefront aberration depending on the interferometer, and O be the wavefront aberration depending on oil, the wavefront measurement data $D_1$ measured in the state setting the optical member can be represented as $$D_1 = W + E + O.$$

Since the wavefront measurement data $D_2$ measured in the state without setting the optical member includes the wavefront aberration E depending on the interferometer and the wavefront aberration O depending on oil, it can be represented as $$D_2 = E + O.$$

Therefore, when the wavefront data $D_2$ measured in the state without setting the optical member is subtracted from the wavefront data $D_1$ measured in the state setting the optical member, $$D_1-D_2=W+E+O-(E+O)=W$$

whereby the wavefront aberration W depending on the inner homogeneity can be isolated and determined alone.

However, it takes time for operations of setting an optical member to an interferometer and removing the former from the latter, whereby the state of the interferometer or oil may change due to temperature fluctuations and the like during this time. In actual measurement operations, in general, wavefront data is initially determined before setting the optical member, and thus obtained data is used for measuring the wavefront aberration of a plurality of optical members. In such a case, the initial data is used for a long period of time, so that a greater temperature fluctuation may occur, thereby causing a possibility of greatly changing the states of interferometer and oil. Namely, E and O cannot be considered constant anymore, so that the wavefront aberration W inherent in the optical member cannot be isolated alone.

Figure 7A:
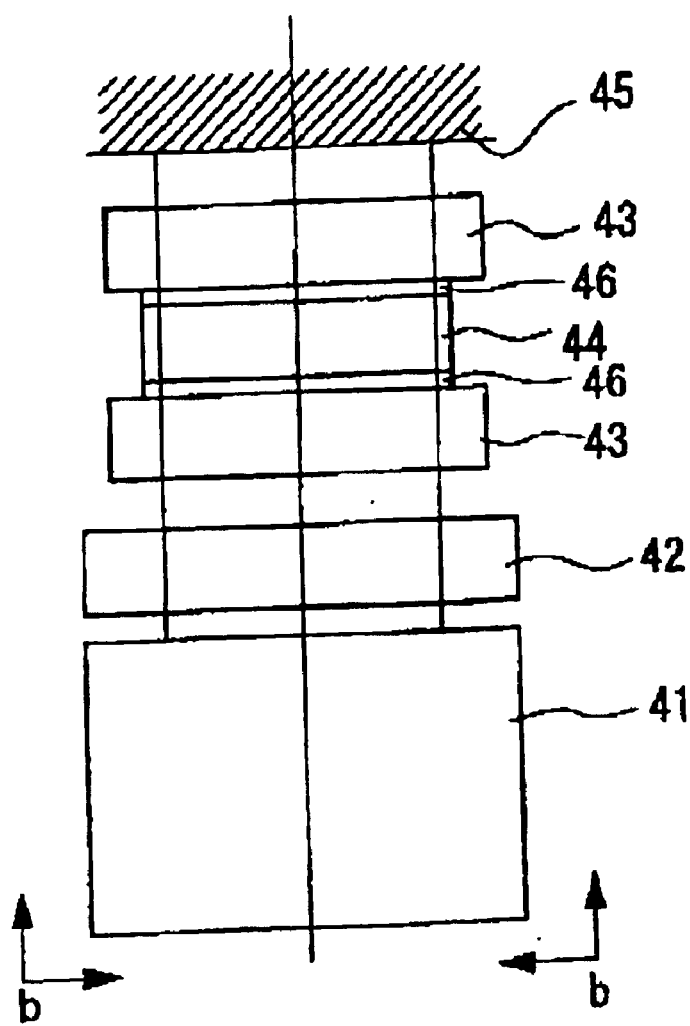
Figure 7B:
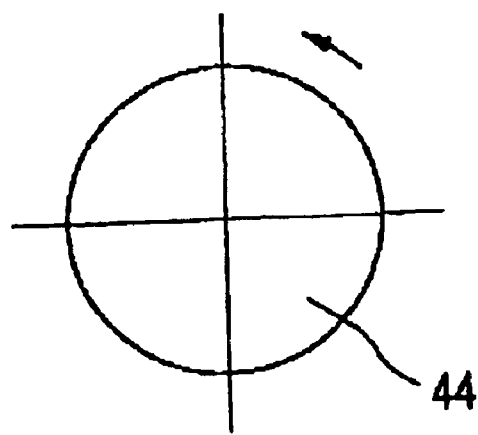
FIG. 7B is a schematic plan view showing the optical member as seen in the direction of line b—b in FIG. 7A.

Therefore, in order to measure the wavefront aberration of the object to be measured with a higher accuracy, the inventors propose the following method. Namely, at first, an optical member as the object to be measured is set to an interferometer, and wavefront data is determined. Subsequently, while rotating the optical member about the optical axis, wavefront data is determined at each appropriate angle (FIGS. 7A and 7B).

Then, data obtained by averaging a plurality of wavefront measurement data items at the respective angles is subtracted from the wavefront data measured before rotating the optical member. This determines the non-rotationally symmetric element in the rotationally symmetric and non-rotationally symmetric elements constituting the wavefront aberration inherent in the optical member. Subsequently, wavefront data is determined in a state where the optical member is shifted in a direction perpendicular to the optical axis (FIGS. 8A and 8B) and is subtracted from the wavefront data measured before shifting.

This determines the rotationally symmetric element in the rotationally symmetric and non-rotationally symmetric elements constituting the wavefront aberration inherent in the optical member. Thus determined rotationally symmetric and non-rotationally symmetric elements are added together, whereby the wavefront aberration inherent in the optical member is determined. The time required for rotating or shifting the optical member is so short that changes in the states of interferometer and oil are considered to be substantially negligible. Therefore, such a method can measure the wavefront aberration with a higher accuracy.

The principle of measuring the wavefront aberration of an optical member according to the above-mentioned embodiment will be explained. First, the wavefront aberration W depending on the inner homogeneity of the optical member is expressed as $$W=Ws+Wa \quad (14)$$

when classified according to elements constituting the same, assuming Ws to be the rotationally symmetric element, and Wa to be the non-rotationally symmetric element (the total of the odd rotationally symmetric element, even rotationally symmetric element, and residual). As shown in FIGS. 7A and 7B, respective wavefront data items measured at individual angles while rotating the optical member by 360°/n are referred to as Dw(1), Dw(2), . . . , Dw(n), and respective wavefront aberrations (inner homogeneity values) of the optical member at the individual angles are referred to as W(1), W(2), . . . , W(n). Here, since the rotationally symmetric element is defined as $$Ws=\Sigma W(i)/n, \quad (15)$$

$$W(i)=Ws+Wa(i) \quad (16)$$

from expression (14). Therefore, $$\Sigma W(i)/n=\Sigma Ws/n+\Sigma Wa(i)/n,$$

which becomes $$\Sigma Wa(i)/n=\Sigma W(i)/n-\Sigma Ws/n=Ws=0$$

by transposing terms, namely, the value of the non-rotationally symmetric element averaged by rotation becomes zero. Letting S be the wavefront aberration of plane-parallel plate members, K be the wavefront aberration of the measurement optical system of the interferometer, and M be the wavefront aberration of the reflecting surface, the rotationally averaged data becomes $$\Sigma Dw(i)/n=\Sigma W(i)/n+S+K+M=Ws+E+O \quad (17)$$

according to the definition of expression (15). From expression (16), the wavefront data Dw(1) of the optical member in the direction of 0° becomes $$Dw(1)=W(1)+S+K+M=Ws+Wa(1)+E+O. \quad (18)$$

Hence, when the expression of rotationally averaged data (17) is subtracted from expression (18), $$Dw(1)-\Sigma D(i)/n=Wa(1).$$

Namely, the non-rotationally symmetric element Wa is determined.

Figure 8A:
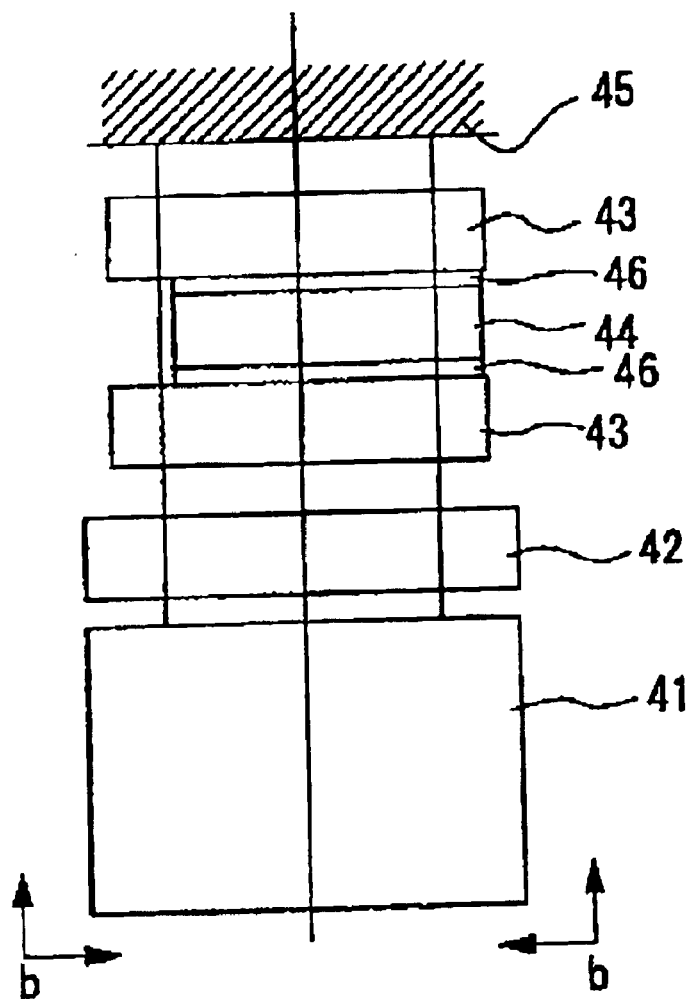
Figure 8B:
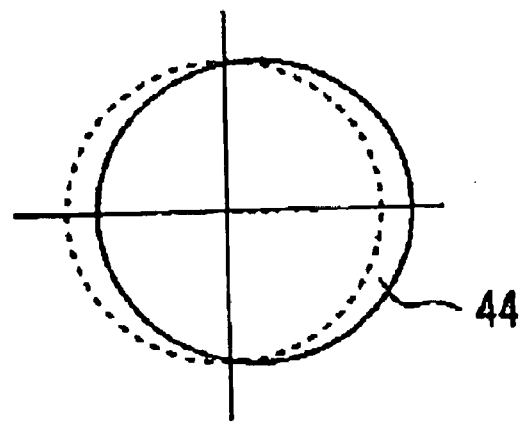
FIG. 8B is a schematic plan view showing the optical member as seen in the direction of line b—b in FIG. 8A.

Next, letting Dw(x) be the wavefront data obtained by shifting the optical member sidewise as shown in FIGS. 8A and 8B, and Ws(x) and Wa(x) be the rotationally symmetric and non-rotationally symmetric elements of inner homogeneity of the optical member, respectively, at this time, $$Dw(x)=Ws(x)+Wa(x)+E+O. \quad (19)$$

When this wavefront data Dw(x) is subtracted from the wavefront data Dw(1) in the direction of 0° (no shift state), $$Dw(1)-Dw(x)=(Ws+Wa)-(Ws(x))$$

from expressions (18) and (19). Here, since Wa is known, Wa(x) determined based thereon is also known. By transposing unknown terms to the left side, and measurement data terms to the right side, $$Ws-Ws(x)=Dw(1)-Dw(x)-(Wa-Wa(x)).$$

Since Ws(x) is determined by using the fact that the rotationally symmetric element Ws is data superposed upon sidewise shifting whereas the rotationally symmetric element comprises concentrically distributed contour lines, this term is also transposed to the right side, whereby $$Ws=Dw(1)-Dw(x)-(Wa-Wa(x))+Ws(x),$$

which determines the rotationally symmetric element Ws. Namely, since the data structure of the wavefront aberration inherent in the optical member is as shown in expression (14), the wavefront aberration (inner homogeneity) inherent in the optical member is determined.

Though the accuracy of measurement becomes higher as the number of operations of obtaining wavefront data by rotating the optical member increases in principle, it takes a longer time for measurement, whereby the states of interferometer and oil fluctuate more, thus causing the measurement accuracy to decrease. Therefore, it is considered appropriate if the number of operations is 3 to 4 in actual measurement. The number of operations may be 2 in order to carry out measurement in a short period of time. In this case, it is not necessary for their positional relationship to be diagonal (e.g., 0° and 180°), but may be a combination of 0° and 60°, for example.

Though the measurement accuracy becomes higher as the amount by which the optical member is shifted sidewise is greater in principle, the state in which the optical member is supported and the like may change, thereby causing the measurement accuracy to decrease. Therefore, the sidewise shifting amount should not be enhanced more than necessary, and is considered appropriate if it is about 10% of the diameter of the optical member.

The method of expanding thus determined wavefront aberration to an orthogonal function system such as a Zernike cylindrical function is as explained above.

Next, a method of making a favorable optical member will be explained with reference to silica glass made by a method known as direct method by way of example.

In the direct method, which is one of silica glass synthesizing methods, a silicon compound gas diluted with a carrier gas is jetted out from a multitube burner made of silica glass in a furnace. At this time, oxygen and hydrogen gases are also jetted out from the multitube burner made of silica glass and are burned, so that high-purity silica glass is deposited while in a transparent state onto a target, whereby an ingot is obtained. Examples of silicon compound gas include chlorine compounds (e.g., $SiCl_4$ and the like), various organic silicon compounds, fluorine compounds (e.g., $SiF_4$ and the like), and so forth. Upon synthesis, the target is descended while being rotated and periodically swung at the same time, so that the upper surface of the ingot is always positioned constant with respect to the burner.

Also, the temperature in the upper part of the ingot is measured, and the burner and ingot are moved relative to each other within a plane according to the result of measurement. This is effected in order to optimize the refractive index homogeneity of the silica glass ingot by controlling the temperature distribution pattern in the upper part of the ingot caused by the burner form, jetted gas amount, and the like in combination with the temperature distribution pattern caused by the relative movement between the burner and ingot.

A characteristic feature of the direct method lies in that members having a higher resistance to excimer laser and a greater diameter can be obtained thereby in comparison with other methods. The refractive index homogeneity of the silica glass is determined by impurities and the density distribution. Examples of impurities include OH, Cl, F, metal impurities, dissolved gases, and the like. In the case of direct method using a chlorine compound as a material gas, for example, OH contained by several hundred ppm or more and, secondly, Cl contained by several ten ppm are considered predominant.

As the density distribution, that caused by thermal history is predominant. Since the refractive index distribution is determined by such factors, a manufacturing method which always keeps the geometric center position in each of steps of (1) synthesis, (2) heat treatment for homogenizing and shaping, (3) annealing for excluding strain, and (4) machining such as cutting/rounding is necessary in order to obtain silica glass having a favorable refractive index homogeneity. An example of the manufacturing method will be shown in the following.

Figure 9:
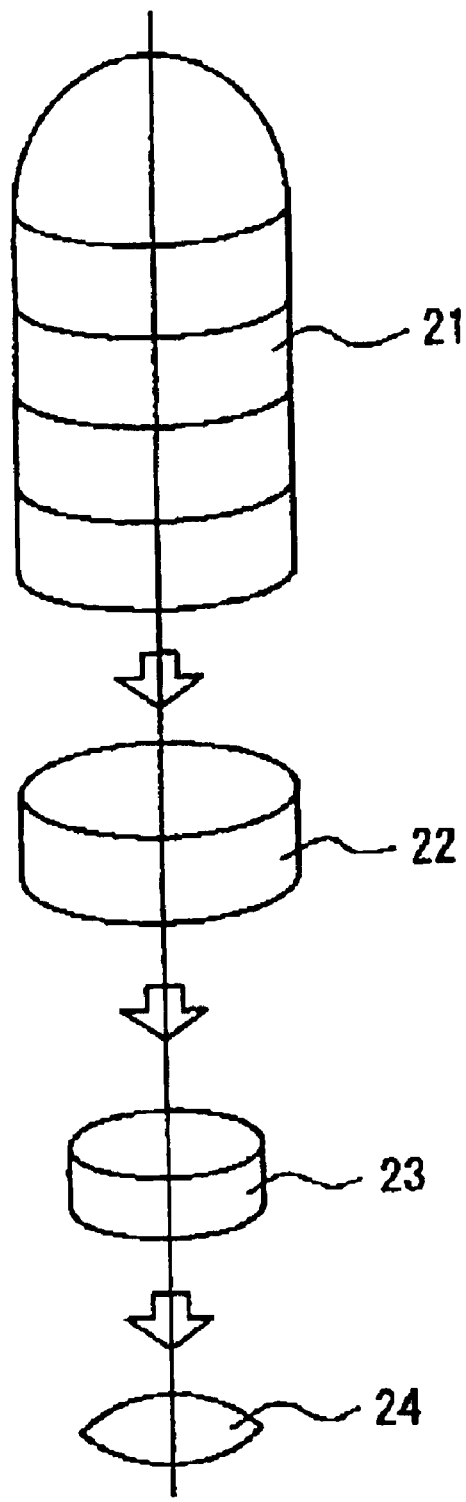
FIG. 9 is a schematic exploded view for explaining steps of obtaining an optical member from an ingot.

Since silica glass is synthesized while rotating the target, the impurity concentration distribution, the physical property distribution, and the refractive index distribution based thereon in the ingot manufactured are macroscopically symmetrical about the center. FIG. 9 shows steps of yielding an optical member from thus obtained ingot. First, the ingot 21 is cut into a plurality of columnar members 22. Since the side face of the columnar members 22 is the side face of ingot itself, the center of the columnar members 22 becomes the center of the ingot 21. When the center of the columnar member 22 is marked on a cross section so as to become a reference for subsequent machining such as cutting and rounding, the center axis of the ingot 21 and the center axis of silica glass components coincide with each other, whereby lenses with a macroscopically favorable symmetry about the center can be expected to be made eventually.

As mentioned above, the refractive index distribution of silica glass is determined by the density distribution caused by impurities and thermal history, which can be controlled according to synthesizing conditions. To this aim, it is necessary that materials, oxygen, hydrogen, exhaust flow rate, target rpm, descending rate, and the like which are influential in fluctuations of synthesizing conditions have configurations which are controllable with a high accuracy. For aligning the respective centers of the furnace, burner, and ingot, they are positioned with reference to the optical axis of laser light.

The columnar member 22 is obtained from the ingot 21 synthesized by such a method, and its upper and lower faces are subjected to shaving and then are ground to a high precision, thus yielding an optical member. The refractive index distribution of such an optical member is measured by an interferometer; each of the rotationally symmetric, odd-symmetric, and even-symmetric elements of wavefront aberration is separated into lower-, middle-, and higher-order elements; and the residual, the residual RMS value, and the like are determined. Then, for reducing these values, synthesizing conditions are adjusted, and the synthesis is carried out again. For example, control of the gas flow rate of the burner or control of the condition under which the burner and the target are moved relative to each other at the time of synthesis is carried out.

Also, in the heat treatment after the synthesis, placement of $SiO_2$ powder or mass on the upper/lower side or on the side face for regulating the heat dissipation at the time of temperature drop, adjustment of temperature descending rate at the time of annealing, adjustment of holding pressure at the time of HIP (hot isostatic pressing) after annealing, and the like can control each of the above-mentioned values. However, the symmetry about the center will be lost if heat treatment is carried out at a high temperature exceeding 1700° C.

These methods can adjust the refractive index distribution, so as to yield desirable optical performances. Such an optical member 22 is rounded, so as to yield a silica glass member 23 to be processed into a lens. Subsequently, processing such as shaving and grinding is carried out, so as to make a projection lens 24. The foregoing steps make optical elements such as lenses, prisms, and reflecting mirrors having various forms, which are appropriately combined together and assembled into a lens barrel, so as to make a projection optical system, and then such a projection optical system is assembled into an excimer laser stepper.

Figure 10:
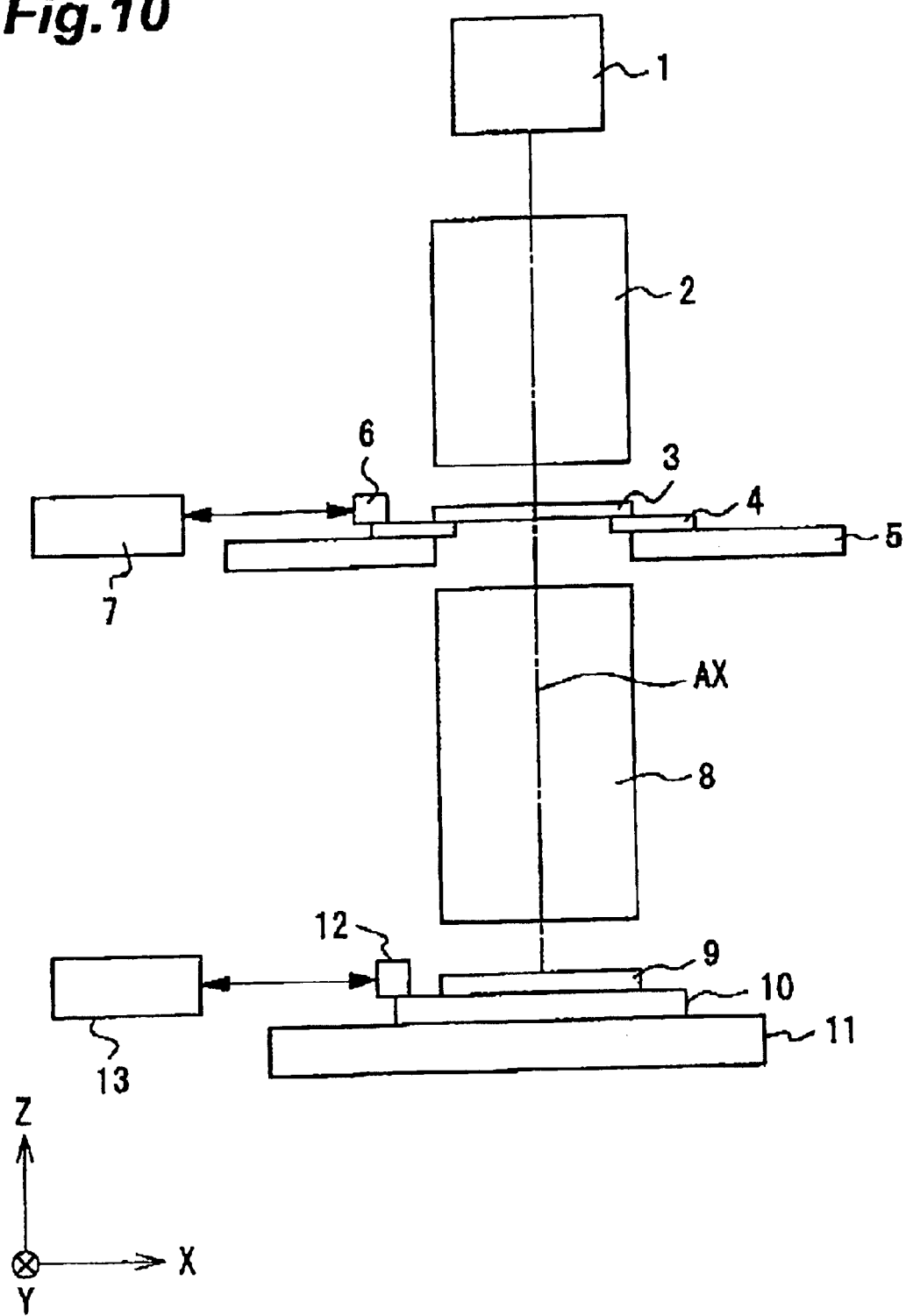
FIG. 10 is a schematic side view showing an embodiment of excimer laser stepper.

FIG. 10 shows a conceptual view of the excimer laser stepper. In this drawing, 8 is a projection optical system, 1 is an excimer laser light source, 2 is an illumination optical system, 3 is a mask, and 9 is a silicon wafer for projection under demagnification. Provided as the light source 1 for emitting illumination light in a UV region is $F_2$ laser (oscillation center wavelength at 157.6 nm). The light emitted from the light source 1 illuminates, at a uniform illuminance, by way of the illumination optical system 2, the mask 3 formed with a predetermined pattern.

In the optical path extending from the light source 1 to the illumination optical system 2, one or a plurality of mirrors for bending the optical path as necessary are disposed. The illumination optical system 2 comprises an optical integrator, a field stop, a field stop optical system, and the like. The optical integrator forms a predetermined surface light source, for example, by a flyeye lens, an internal reflection type integrator, or the like. The field stop is used for defining the size/form of the illumination area on the mask 3, whereas the field stop optical system is used for projecting the field stop image onto the mask.

The optical path between the light source 1 and the illumination optical system 2 is tightly sealed with a casing (not depicted), whereas the space from the light source 1 to the lens closest to the mask in the illumination optical system 2 is filled with an inert gas exhibiting a low absorptivity with respect to the exposure light.

By way of a mask holder 4, the mask 3 is held on a mask stage 5 so as to become parallel to the XY plane. The mask 3 is formed with a pattern to be transferred. In the whole pattern area, a rectangular (slit-like) region having a shorter side along the X direction and a longer side along the Y direction is illuminated.

The mask stage 5 is two-dimensionally movable along the mask surface (i.e., XY plane), whereas its positional coordinates are measured by an interferometer 7 using a mask movable mirror 6, so as to effect positional control.

The light transmitted through the pattern formed in the mask 3 forms a mask pattern image onto the wafer 9, which is a photosensitive substrate, by way of the projection optical system 8. By way of a wafer holder 10, the wafer 9 is held on a wafer stage 11 so as to become parallel to the XY plane. The wafer stage 11 is two-dimensionally movable along the XY plane such that a rectangular exposure area having a shorter side along the X direction and a longer side along the Y direction on the wafer 9 optically corresponds to the rectangular illumination area on the mask 3. Positional coordinates of the wafer holder 10 are measured by an interferometer 13 using a wafer movable mirror 12, so as to effect positional control.

The inside of the projection optical system 8 is constructed so as to keep a hermetic state, whereas the space there with in is filled with an inert gas.

Disposed within the narrow optical path between the illumination optical system 2 and the projection optical system 8 are the mask 3, the mask stage 5, and the like. A casing (not depicted) tightly surrounding the mask 3, the mask stage 5, and the like is filled with an inert gas.

As such, an atmosphere which hardly absorbs exposure light is formed throughout the optical path extending from the light source 1 to the wafer 9.

As mentioned above, the illumination area on the mask 3 illuminated by way of the projection optical system 8 and the exposure area on the wafer 9 are in a rectangular form having a shorter side along the X direction. Therefore, while carrying out positional control of the mask 3 and wafer 9 by using a driving system, interferometers (7, 13), and the like, the mask stage 5 and the wafer stage 11 are moved (scanned) in synchronization with each other along the shorter side direction of the rectangular illumination area and exposure area, i.e., X direction, whereby the mask pattern is exposed in a scanning fashion to a region having a width identical to the longer side of the exposure area and a length corresponding to the moving (scanning) amount of the wafer 9.

Such a configuration enables photolithography which can yield fine and vivid patterns. The present invention can yield a pattern having a line width of 0.3 µm or shorter.

EXAMPLES

In the following, the present invention will be explained more specifically with reference to Examples, which do not restrict the present invention.

Example 1

Using the above-mentioned direct method, a plurality of ingots each having a diameter of 500 mm and a length of 800 mm were made, and disk-shaped test pieces were horizontally cut out from these ingots. At this time, the center of rotation of ingots and the center of disks were aligned with each other. For excluding strain and homogeneity adjustment, the test pieces were set at the center of an annealing furnace having a temperature distribution symmetric about the center and were subjected to annealing while rotating (held at 1000° C. for 24 hours, then cooled to 500° C. with a temperature gradient of −10° C./min, and left to cool thereafter).

Further, from these disks, disk-shaped optical members each having a diameter of 300 mm and a thickness of 60 mm were extracted by using a core drill, and their upper and lower faces were ground. At this time, the center of rotation of the ingot and the center of each disk were aligned with each other. For evaluating the refractive index homogeneity of this member, it is necessary to know the tilted component of refractive index. This is because of the fact that the tilted component of refractive index is hard to measure directly with an interferometer. Therefore, two prism-shaped samples were taken out from both ends of this member in the diametric direction, respectively, and the refractive index of each sample was measured with an accuracy on the order of $10^{-7}$ according to the minimum deviation method by using a highly accurate spectrometer. As a result, the refractive index difference between the two samples was not greater than the measurement limit, i.e., $-10^{-7}$ or less.

Subsequently, the disk-shaped member was set to a Fizeau type interferometer, using an He—Ne laser at a wavelength of 633 nm as a light source, for measuring flat optical members, and its wavefront aberration was measured in 100×100 mesh measurement points (ρ,θ) by the oil-on-plate method. Using thus measured wavefront aberration data, the wavefront aberration profile was fitted (applied) to a Zernike cylindrical function system $Zn$ (ρ,θ) to terms where n=0 to 80. Namely, from a plurality of measurement data items, expansion coefficients of $C_0$ to $C_{80}$ were determined by the least-squares method.

Then, thus determined expansion coefficients were put into expression (1), so as to calculate W(ρ,θ) for each measurement point. Next, thus determined expansion coefficients were put into expressions (5) to (13), so as to calculate the lower-order $W_{rot}$, lower-order $W_{odd}$, lower-order $W_{evn}$, middle-order $W_{rot}$, middle-order $W_{odd}$, middle-order $W_{evn}$, higher-order $W_{rot}$, higher-order $W_{odd}$, and higher-order $W_{evn}$ for each measurement point; and from these values, the lower-order $r_{rot}$, lower-order $r_{odd}$, lower-order $r_{evn}$, middle-order $r_{rot}$, middle-order $r_{odd}$, middle-order $r_{evn}$ higher-order $r_{rot}$, higher-order $r_{odd}$, and higher-order $r_{evn}$ were calculated. Also, for each measurement point, the difference between the actual measurement data and $W(\rho,\theta)$ calculated according to expression (1) by substitution was determined, so as to yield a residual, and the residual RMS value was calculated from these values. As such, RMS values according to the Zernike cylindrical function system where n=0 to 80 were determined in the disk-shaped optical members made from the ingots manufactured under various conditions.

Then, the disk-shaped optical members were sorted into a plurality of classes according to the magnitude of thus determined RMS values. Thereafter, using only the disk-shaped optical members sorted into one class at first, a plurality of kinds of lenses necessary for constructing a projection optical system for use in a photolithography exposure apparatus employing an ArF excimer laser as a light source were obtained by processing. Subsequently, these lenses were combined together so as to construct the projection optical system, thereby assembling a projection optical system constituted by the optical members corresponding to this class. For other classes, respective projection optical systems constituted by optical members corresponding to these classes were assembled successively as mentioned above. Thus, the projection optical systems constituted by the respective optical members corresponding to the individual classes were produced, and wavefront aberrations of these projection optical systems were evaluated with a Fizeau type interferometer.

Figure 11:
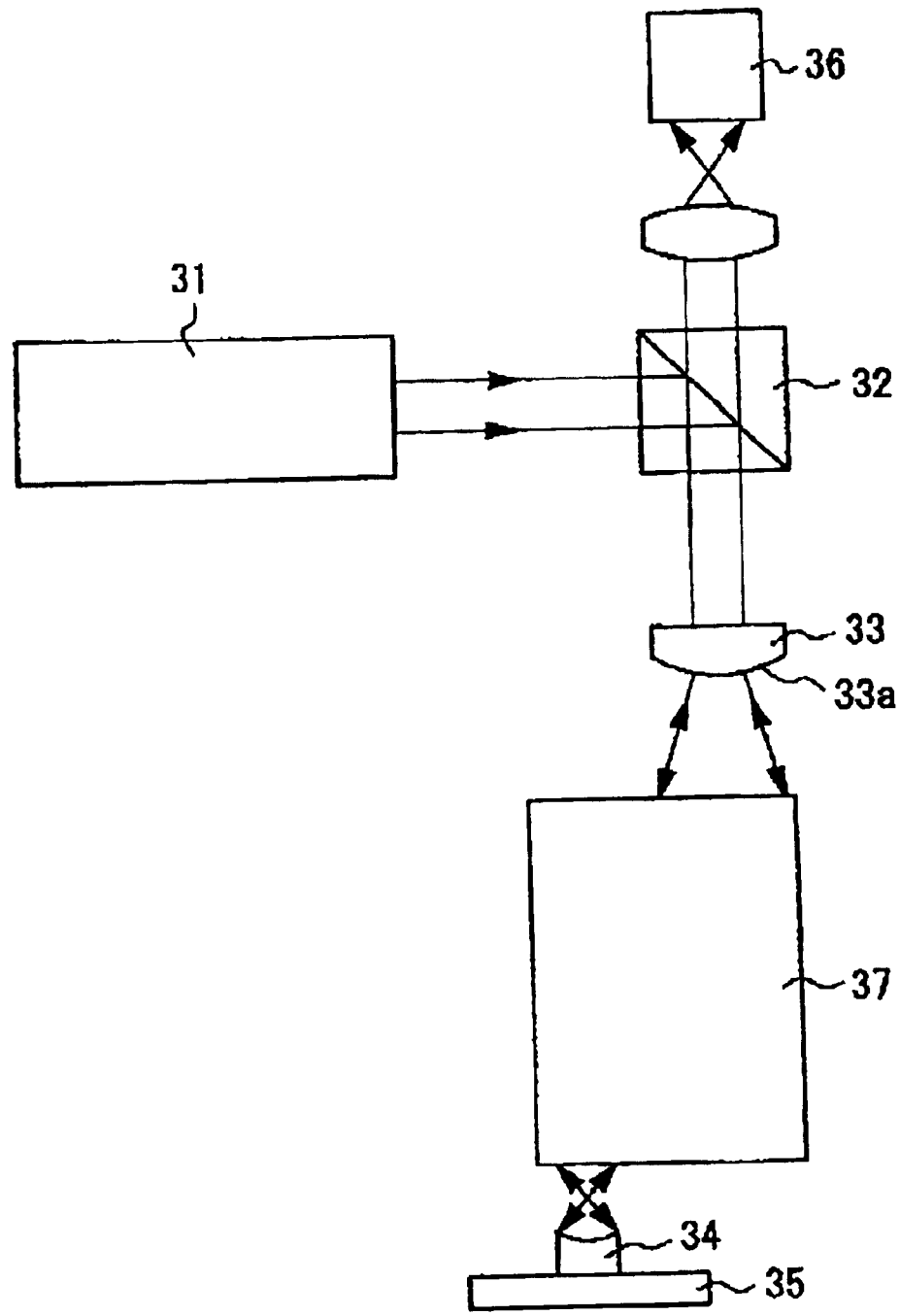
FIG. 11 is a schematic side view showing the principle of evaluating wavefront aberration, which is effected by a Fizeau type interferometer for measuring optical systems.

Here, the principle of wavefront aberration caused by a Fizeau type interferometer for measuring optical systems will be explained with reference to FIG. 11. A light source 31 is required to use light having the same wavelength as that actually employed in the exposure apparatus. Here, an ArF excimer laser is used as the light source 31. The luminous flux emitted from the light source 31 is reflected by (or transmitted through) a half prism 32, so as to be made incident on a Fizeau lens 33. A part of the luminous flux incident on the Fizeau lens 33 is reflected by a reference surface 33a of the Fizeau lens, so as to become reference light, which travels back the incoming path to return to the half prism 32. The other part of luminous flux incident on the Fizeau lens 33 is transmitted through the reference surface 33a, so as to become measurement light. The measurement light passes through a set projection optical system 37 and is reflected by a spherical mirror 34 mounted on an XY stage 35, so as to travel back the incoming path to return to the half prism 32. The reference light and measurement light incident on the half prism 32 are transmitted through (or reflected by) the half prism 32, so as to form an image of the spherical mirror 34 on an imaging device 36.

When the projection optical system 37 has no aberration, the measurement light is incident on individual points of the spherical mirror 34 in the same phase, and returns to individual points of the reference surface 33a of the Fizeau lens in the same phase. As a consequence, the reference light and measurement light have the same phase difference at each point on the imaging device 36, whereby the image of the spherical mirror 34 yields a uniform intensity distribution. When the projection optical system 37 has an aberration, by contrast, the phase difference between reference light and measurement light varies among the individual points on the imaging device 36, where by interference fringes are seen as an image of the spherical mirror 34. Since the measurement light has passed through the projection optical system 37 twice, the wavefront aberration W of the projection optical system 37 can be determined by dividing the phase difference of interference fringes by 2.

Dividing the imaging device 36 into elements of 100×100 mesh, the value of wavefront aberration W in each element is determined, and its RMS value is calculated, so as to evaluate the optical performance of the projection optical system 37.

The following Table 1 shows the RMS values of elements of the disk-shaped optical members used for lenses constituting the individual projection optical systems, results of determination of optical performances, wavefront aberration RMS, and second- and fourth-order residual RMS and PV values according to a conventional evaluating method. Namely, the RMS values of individual elements of the disk-shaped optical member used for a plurality of lenses constituting each sample No. of projection optical system are listed in the columns of lower-order $r_{rot}$, lower-order $r_{odd}$, lower-order $r_{evn}$, middle-order $r_{rot}$, middle-order $r_{odd}$, middle-order $r_{evn}$, higher-order $r_{rot}$, higher-order $r_{odd}$, higher-order $r_{evn}$, and residual RMS value, whereas the results of evaluation of optical performances as the projection optical system and the wavefront aberration RMS value are shown in the columns of optical performance and wavefront aberration RMS, respectively. Also, the second- and fourth-order residual RMS and PV values of each disk-shaped optical member were determined according to the conventional evaluating method described in Japanese Patent Application Laid-Open No. HEI 8-5505, and thus obtained results are shown in the columns of second/fourth-order RMS and second/fourth-order PV, respectively.

TABLE 1

| Sample No. | Lower-order rrot | Lower-order rodd | Lower-order revn | Middle-order rrot | Middle-order rodd | Middle-order revn | Higher-order rrot | Higher-order rodd | Higher-order revn | Residual RMS | Optical performance | Wavefront aberration RMS | 2nd/4th-order residual RMS | (x λ) 2nd/4th-order residual PV |
|---|---|---|---|---|---|---|---|---|---|---|---|---|---|---|
| 1 | 0.002 | 0.0015 | 0.002 | 0.001 | 0.001 | 0.001 | 0.0002 | 0.0002 | 0.0002 | 0.0002 | ◎ | 0.007 | 0.001 | 0.011 |
| 2 | 0.003 | 0.0025 | 0.003 | 0.002 | 0.002 | 0.002 | 0.0004 | 0.0005 | 0.0005 | 0.0004 | ◎ | 0.008 | 0.003 | 0.015 |
| 3 | 0.008 | 0.006 | 0.007 | 0.004 | 0.003 | 0.004 | 0.001 | 0.0008 | 0.0008 | 0.001 | ◎ | 0.01 | 0.004 | 0.016 |
| 4 | 0.015 | 0.01 | 0.015 | 0.006 | 0.004 | 0.003 | 0.002 | 0.002 | 0.001 | 0.003 | ◎ | 0.013 | 0.005 | 0.018 |
| 5 | 0.02 | 0.02 | 0.02 | 0.008 | 0.008 | 0.008 | 0.003 | 0.003 | 0.003 | 0.004 | ◎ | 0.15 | 0.004 | 0.022 |
| 6 | 0.02 | 0.02 | 0.02 | 0.01 | 0.009 | 0.008 | 0.003 | 0.003 | 0.003 | 0.004 | ○ | 0.18 | 0.004 | 0.023 |
| 7 | 0.04 | 0.03 | 0.03 | 0.008 | 0.008 | 0.007 | 0.004 | 0.003 | 0.003 | 0.005 | ○ | 0.02 | 0.005 | 0.024 |
| 8 | 0.06 | 0.06 | 0.06 | 0.02 | 0.02 | 0.02 | 0.005 | 0.005 | 0.005 | 0.006 | ○ | 0.025 | 0.005 | 0.024 |
| 9 | 0.07 | 0.05 | 0.06 | 0.02 | 0.02 | 0.02 | 0.007 | 0.005 | 0.006 | 0.007 | △ | 0.04 | 0.005 | 0.024 |
| 10 | 0.06 | 0.05 | 0.06 | 0.03 | 0.02 | 0.03 | 0.005 | 0.007 | 0.007 | 0.006 | △ | 0.05 | 0.006 | 0.026 |

TABLE 1-continued

| Sample No. | Lower-order rrot | Lower-order rodd | Lower-order revn | Middle-order rrot | Middle-order rodd | Middle-order revn | Higher-order rrot | Higher-order rodd | Higher-order revn | Residual RMS | Optical performance | Wavefront aberration RMS | 2nd/4th-order residual RMS (× λ) | 2nd/4th-order residual PV (× λ) |
|---|---|---|---|---|---|---|---|---|---|---|---|---|---|---|
| 11 | 0.08 | 0.07 | 0.06 | 0.03 | 0.02 | 0.02 | 0.005 | 0.004 | 0.005 | 0.006 | Δ | 0.05 | 0.006 | 0.025 |
| 12 | 0.06 | 0.07 | 0.06 | 0.03 | 0.03 | 0.02 | 0.006 | 0.007 | 0.005 | 0.008 | x | 0.07 | 0.005 | 0.024 |
| 13 | 0.08 | 0.06 | 0.08 | 0.04 | 0.03 | 0.03 | 0.007 | 0.006 | 0.006 | 0.008 | x | 0 08 | 0.005 | 0.024 |
| 14 | 0.08 | 0.08 | 0.07 | 0.04 | 0.04 | 0.05 | 0.008 | 0.007 | 0.009 | 0.009 | x | 0 1 | 0.007 | 0.03 |

⊙ excellent
o fine
Δ fair
x poor

The results shown in Table 1 have indicated that, with respect to the light source wavelength λ, optical members whose lower-order $r_{rot}$ is 0.06λ or less, lower-order $r_{odd}$ is 0.06λ or less, and lower-order $r_{evn}$ is 0.06λ or less, or middle-order $r_{rot}$ is 0.02λ or less, middle-order $r_{odd}$ is 0.02λ or less, and middle-order $r_{evn}$ is 0.02λ or less, or higher-order $r_{rot}$ is 0.005λ or less, higher-order $r_{odd}$ is 0.005λ or less, and higher-order $r_{evn}$ is 0.005λ or less, or residual RMS is 0.006λ or less yield a wavefront aberration RMS of 0.05λ or less, thus attaining favorable optical performances for photolithography.

It has also been seen that, with respect to the light source wavelength λ optical members whose lower-order $r_{rot}$ is 0.06λ or less, lower-order $r_{odd}$ is 0.06λ or less, and lower-order $r_{evn}$ is 0.06λ or less, and middle-order $r_{rot}$ is 0.02λ or less, middle-order $r_{odd}$ is 0.02λ or less, and middle-order $r_{evn}$ is 0.02λ or less, and higher-order $r_{rot}$ is 0.005λ or less, higher-order $r_{odd}$ is 0.005λ or less, and higher-order $r_{evn}$ is 0.005λ or less, and residual RMS is 0.006λ or less yield a wavefront aberration RMS of 0.025λ or less, thus attaining further favorable imaging performances for photolithography.

It has also been seen that optical members whose lower-order $r_{rot}$ is 0.02λ or less, lower-order $r_{odd}$ is 0.02λ or less, and lower-order $r_{evn}$ is 0.02λ or less, or middle-order $r_{rot}$ is 0.008λ or less, middle-order $r_{odd}$ is 0.008λ or less, and middle-order $r_{evn}$ is 0.008λ or less, or higher-order $r_{rot}$ is 0.003λ or less, higher-order $r_{odd}$ is 0.003λ or less, and higher-order $r_{evn}$ is 0.003λ or less, or residual RMS is 0.004λ or less yield a wavefront aberration RMS of 0.025λ or less, thus attaining further favorable optical performances for photolithography, and are favorable as optical members for projection optical systems in particular.

It has also been seen that optical members whose lower-order $r_{rot}$ is 0.02λ or less, lower-order $r_{odd}$ is 0.02λ or less, and lower-order $r_{evn}$ is 0.02λ or less, and middle-order $r_{rot}$ is 0.008λ or less, middle-order $r_{odd}$ is 0.008λ or less, and middle-order $r_{evn}$ is 0.008λ or less, and higher-order $r_{rot}$ is 0.003λ or less, higher-order $r_{odd}$ is 0.003λ or less, and higher-order $r_{evn}$ is 0.003λ or less, and residual RMS is 0.004λ or less yield a wavefront aberration RMS of 0.015λ or less, thus attaining further favorable optical performances for photolithography, and are favorable as optical members for projection optical systems in particular.

Further, the results of samples No. 12 and No. 13, for example, have indicated that, even when disk-shaped optical members exhibiting sufficiently low second- and fourth-order residual RMS and PV values according to the conventional evaluating method are processed into lenses so as to constitute projection optical systems, their wavefront aberration RMS does not always exhibit small values, i.e., their optical performances do not always become favorable. On the contrary, the results of samples No. 10 and No. 11, for example, have indicated that, even when disk-shaped optical members exhibiting relatively large second- and fourth-order residual RMS and PV values according to the conventional evaluating method are processed into lenses so as to constitute projection optical systems, their wavefront aberration RMS may exhibit small values, i.e., their optical performances may become favorable.

Example 2

Using the wavefront aberration data measured from individual optical members (sample Nos. 2, 3, 4, 5, 6, 7, 8, 9, 10, 12, and 14), the wavefront aberration profile was fitted (applied) to a Zernike cylindrical function system $Z_n(\rho,\theta)$ to terms where n=0 to 35. Namely, from a plurality of measurement data items, expansion coefficients of $C_0$ to $C_{35}$ were determined by the least-squares method.

Then, thus determined expansion coefficients were put into expression (1), so as to calculate $W(\rho,\theta)$ for each measurement point. Next, thus determined expansion coefficients were put into expressions (5) to (10), so as to calculate the lower-order $W_{rot}$, lower-order $W_{odd}$, lower-order $W_{evn}$, middle-order $W_{rot}$, middle-order $W_{odd}$, and middle-order $W_{evn}$; and from these values, the lower-order $r_{rot}$, lower-order $r_{odd}$, lower-order $r_{evn}$ middle-order $r_{rot}$, middle-order $r_{odd}$, and middle-order $r_{evn}$ were calculated. Also, for each measurement point, the difference between the actual measurement data and $W(\rho,\theta)$ calculated by expression (1) by substitution was determined, so as to yield a higher-order residual, and the residual RMS value was calculated from these values. As such, RMS values according to the Zernike cylindrical function system where n=0 to 35 were determined in the disk-shaped optical members of sample Nos. 2, 3, 4, 5, 6, 7, 8, 9, 10, 12, and 14 in Example 1.

The following Table 2 shows the RMS values of elements of the disk-shaped optical members used for lenses constituting the individual projection optical systems, results of determination of optical performances, wavefront aberration RMS, and second- and fourth-order residual RMS and PV values according to the conventional evaluating method.

TABLE 2

| Sample No. | Lower-order rrot | Lower-order rodd | Lower-order revn | Middle-order rrot | Middle-order rodd | Middle-order revn | Higher-order residual RMS | Optical performance | Wavefront aberration RMS | 2nd/4th-order residual RMS (x λ) | 2nd/4th-order residual PV |
|---|---|---|---|---|---|---|---|---|---|---|---|
| 1  | 0.003 | 0.0025 | 0.003 | 0.002 | 0.002 | 0.002 | 0.0005 | ⊚ | 0.008 | 0.003 | 0.015 |
| 2  | 0.008 | 0.006  | 0.007 | 0.004 | 0.003 | 0.004 | 0.0008 | ⊚ | 0.01  | 0.004 | 0.016 |
| 3  | 0.015 | 0.01   | 0.015 | 0.006 | 0.004 | 0.003 | 0.002  | ⊚ | 0.013 | 0.005 | 0.018 |
| 4  | 0.02  | 0.02   | 0.02  | 0.008 | 0.008 | 0.008 | 0.004  | ⊚ | 0.015 | 0.004 | 0.022 |
| 5  | 0.02  | 0.02   | 0.02  | 0.01  | 0.009 | 0.008 | 0.006  | ○ | 0.018 | 0.004 | 0.023 |
| 6  | 0.04  | 0.03   | 0.03  | 0.008 | 0.009 | 0.009 | 0.004  | ○ | 0.02  | 0.005 | 0.024 |
| 7  | 0.06  | 0.06   | 0.06  | 0.02  | 0.02  | 0.02  | 0.01   | ○ | 0.025 | 0.005 | 0.024 |
| 8  | 0.07  | 0.05   | 0.06  | 0.02  | 0.02  | 0.02  | 0.015  | Δ | 0.04  | 0.005 | 0.024 |
| 9  | 0.06  | 0.05   | 0.06  | 0.03  | 0.02  | 0.03  | 0.01   | Δ | 0.05  | 0.006 | 0.026 |
| 10 | 0.06  | 0.07   | 0.06  | 0.03  | 0.03  | 0.02  | 0.02   | x | 0.07  | 0.005 | 0.024 |
| 11 | 0.08  | 0.08   | 0.07  | 0.04  | 0.04  | 0.05  | 0.0325 | x | 0.1   | 0.007 | 0.03  |

⊚ excellent
○ fine
Δ fair
x poor

The results shown in Table 2 have indicated that, with respect to the light source wavelength λ, optical members whose lower-order $r_{rot}$ is 0.06λ or less, lower-order $r_{odd}$ is 0.06λ or less, and lower-order $r_{evn}$ is 0.06λ or less, or middle-order $r_{rot}$ is 0.02λ or less, middle-order $r_{odd}$ is 0.02λ or less, and middle-order $r_{evn}$ is 0.02λ or less, or higher-order residual RMS is 0.01λ or less yield a wavefront aberration RMS of 0.05λ or less, thus attaining favorable optical performances for photolithography.

It has also been seen that, with respect to the light source wavelength λ optical members whose lower-order $r_{rot}$ is 0.06λ or less, lower-order $r_{odd}$ is 0.06λ or less, and lower-order $r_{evn}$ is 0.06λ or less, and middle-order $r_{rot}$ is 0.02λ or less, middle-order $r_{odd}$ is 0.02λ or less, and middle-order $r_{evn}$ is 0.02λ or less, and higher-order residual RMS is 0.01λ or less yield a wavefront aberration RMS of 0.025λ or less, thus attaining more favorable optical performances for photolithography.

It has also been seen that optical members whose lower-order $r_{rot}$ is 0.02λ or less, lower-order $r_{odd}$ is 0.02λ or less, and lower-order $r_{evn}$ is 0.02λ or less, or middle-order $r_{rot}$ is 0.008λ or less, middle-order $r_{odd}$ is 0.008λ or less, and middle-order $r_{evn}$ is 0.008λ or less, or higher-order residual RMS is 0.004λ or less yield a wavefront aberration RMS of 0.025λ or less, thus attaining more favorable optical performances for photolithography, and are favorable as optical members for projection optical systems in particular.

It has also been seen that optical members whose lower-order $r_{rot}$ is 0.02λ or less, lower-order $r_{odd}$ is 0.02λ or less, and lower-order $r_{evn}$ is 0.02λ or less, and middle-order $r_{rot}$ is 0.008λ or less, middle-order $r_{odd}$ is 0.008λ or less, and middle-order $r_{evn}$ is 0.008or less, and higher-order residual RMS is 0.004λ or less yield a wavefront aberration RMS of 0.015λ or less, thus attaining further favorable optical performances for photolithography, and are favorable as optical members for projection optical systems in particular.

Further, the results of sample No. 12, for example, have indicated that, even when a disk-shaped optical member exhibiting sufficiently low second- and fourth-order residual RMS and PV values according to the conventional evaluating method is processed into a lens so as to constitute a projection optical system, its wavefront aberration RMS does not always exhibit a small value, i.e., its optical performances do not always become favorable. On the contrary, the results of sample No. 10, for example, have indicated that, even when a disk-shaped optical member exhibiting relatively large second- and fourth-order residual RMS and PV values according to the conventional evaluating method is processed into a lens so as to constitute a projection optical system, its wavefront aberration RMS may exhibit a small value, i.e., its optical performances may become favorable.

Though the above-mentioned embodiment of the present invention separates the measured wavefront aberration into rotationally symmetric, odd-symmetric, and even-symmetric components, and then separates each component into lower-, middle-, and higher-order elements, this order may be reversed. Namely, totally the same results are obtained when the measured wavefront aberration is separated into lower-, middle-, and higher-order elements, and then each element is separated into rotationally symmetric, odd-symmetric, and even-symmetric components. Thus, the present invention encompasses not only the former procedure but also the latter procedure.

Comparative Example

Using the direct method similar to that in Example 1, a plurality of columnar ingots each having a diameter of 200 mm and a length of 400 mm were made. In the state heated to the softening temperature, thus obtained ingot was pressed to collapse while twisting its end faces leftward and rightward, whereby a test piece having a diameter of about 500 mm and a thickness of about 60 mm was formed eventually. Then, for excluding strain and homogeneity adjustment, the test piece was set at the center of an annealing furnace having a temperature distribution symmetric about the center and were subjected to annealing while rotating (held at 1000° C. for 24 hours, then cooled to 500° C. with a temperature gradient of −10° C./min, and left to cool thereafter).

Further, from these disks, disk-shaped optical members each having a diameter of 300 mm and a thickness of 60 mm were extracted by using a core drill, and their upper and lower faces were ground.

Thereafter, using a Fizeau type interferometer for measuring flat optical members as in Example 1, lower-order $r_{rot}$, lower-order $r_{odd}$, lower-order $r_{evn}$, middle-order $r_{rot}$, middle-order $r_{odd}$, middle-order $r_{evn}$, higher-order $r_{rot}$, higher-order $r_{odd}$, higher-order $r_{evn}$, and residual RMS value were calculated. As such, in the disk-shaped optical members made of the ingots manufactured under the above-mentioned condition, RMS values according to a Zernike cylindrical function system where n=0 to 80 were determined.

Thus obtained RMS values of individual elements yielded large values in higher- and lower-order elements in particular, and large values in the non-rotationally symmetric element as well.

Then, in the same manner as Example 1 except that such disk-shaped optical members were used, lenses were made by processing, so as to assemble projection optical systems. Thus obtained projection optical systems yielded very large wavefront aberration RMS values upon measurement, whereby it was found that they failed to yield favorable optical performances for photolithography.

Industrial Applicability

As explained in the foregoing, the present invention makes it possible to evaluate the refractive index homogeneity of an optical member more accurately, whereby a photolithography optical member having a high refractive index homogeneity and a high quality can be provided more reliably. Therefore, by using such an optical member, the present invention can make not only a high-precision photolithography projection optical system but also a high-performance photolithography exposure apparatus reliably with a high efficiency.

What is claimed is:

1. A method of evaluating a refractive index homogeneity of an optical member for photolithography, said method comprising:
    a measurement step of transmitting light having a predetermined wavelength λ through said optical member so as to measure a wavefront aberration;
    a Zernike fitting step of expanding thus measured wavefront aberration into a polynomial of a Zernike cylindrical function system;
    a first separating step of separating individual components of said polynomial into a rotationally symmetric element, an odd-symmetric element, and an even-symmetric element; and
    a second separating step of separating individual components of said polynomial into a plurality of parts according to a degree thereof.

2. An evaluating method according to claim 1, wherein individual components of said polynomial are separated into three parts of lower, middle, and higher orders in said second separating step.

3. An evaluating method according to claim 2, wherein said three parts of lower, middle, and higher orders are terms where n=4 to 8, n=9 to 35, and n>35 in the polynomial of the Zernike cylindrical function system, respectively, whereas a term where n=0 to 3 is unused for evaluation.

4. An evaluating method according to claim 1, wherein, in said first and second separating steps, individual components of said polynomial are classified such that a rotationally symmetric element, an odd-symmetric element, and an even-symmetric element in a term where n=4 to 8 become a lower-order rotationally symmetric element, a lower-order odd-symmetric element, and a lower-order even-symmetric element, respectively; a rotationally symmetric element, an odd-symmetric element, and an even-symmetric element in a term where n=9 to 35 become a middle-order rotationally symmetric element, a middle-order odd-symmetric element, and a middle-order even-symmetric element, respectively; and a rotationally symmetric element, an odd-symmetric element, and an even-symmetric element in a term where n=36 to 80 become a higher-order rotationally symmetric element, a higher-order odd-symmetric element, and a higher-order even-symmetric element, respectively; and a term where n>80 becomes a residual in said polynomial;

said evaluating method further comprising:
    an RMS value calculating step of calculating an RMS value of each of said lower-order rotationally symmetric element, lower-order odd-symmetric element, lower-order even-symmetric element, middle-order rotationally symmetric element, middle-order odd-symmetric element, middle-order even-symmetric element, higher-order rotationally symmetric element, higher-order odd-symmetric element, higher-order even-symmetric element, and residual; and
    an evaluating step of evaluating whether thus calculated RMS value satisfies a predetermined condition or not.

5. An evaluating method according to claim 4, wherein said evaluating step evaluates whether at least one of the following conditions $(a_1)$, $(b_1)$, $(c_1)$, and $(d_1)$ is satisfied or not:
    $(a_1)$ each of the respective RMS values of the lower-order rotationally symmetric element, lower-order odd-symmetric element, and lower-order even-symmetric element is 0.06λ or less;
    $(b_1)$ each of the respective RMS values of the middle-order rotationally symmetric element, middle-order odd-symmetric element, and middle-order even-symmetric element is 0.02λ or less;
    $(c_1)$ each of the respective RMS values of the higher-order rotationally symmetric element, higher-order odd-symmetric element, and higher-order even-symmetric element is 0.005λ or less; and
    $(d_1)$ the RMS value of the residual is 0.006λ or less.

6. An evaluating method according to claim 4, wherein said evaluating step evaluates whether at least one of the following conditions $(a_2)$, $(b_2)$, $(c_2)$, and $(d_2)$ is satisfied or not:
    $(a_2)$ each of the respective RMS values of the lower-order rotationally symmetric element, lower-order odd-symmetric element, and lower-order even-symmetric element is 0.02λ or less;
    $(b_2)$ each of the respective RMS values of the middle-order rotationally symmetric element, middle-order odd-symmetric element, and middle-order even-symmetric element is 0.008λ or less;
    $(c_2)$ each of the respective RMS values of the higher-order rotationally symmetric element, higher-order odd-symmetric element, and higher-order even-symmetric element is 0.003λ or less; and
    $(d_2)$ the RMS value of the residual is 0.004λ or less.

7. An evaluating method according to claim 5, wherein said evaluating step evaluates whether all of said conditions $(a_1)$, $(b_1)$, $(c_1)$, and $(d_1)$ are satisfied or not.

8. An evaluating method according to claim 6, wherein said evaluating step evaluates whether all of said conditions $(a_2)$, $(b_2)$, $(c_2)$, and $(d_2)$ are satisfied or not.

9. An evaluating method according to claim 1, wherein, in said first and second separating steps, individual components of said polynomial are classified such that a rotationally symmetric element, an odd-symmetric element, and an even-symmetric element in a term where n=4 to 8 become a lower-order rotationally symmetric element, a lower-order odd-symmetric element, and a lower-order even-symmetric element, respectively; a rotationally symmetric element, an odd-symmetric element, and an even-symmetric element in a term where n=9 to 35 become a middle-order rotationally symmetric element, a middle-order odd-symmetric element, and a middle-order even-symmetric element, respectively; and a term where n>35 becomes a higher-order residual in said polynomial;

said evaluating method further comprising:

an RMS value calculating step of calculating an RMS value of each of the lower-order rotationally symmetric element, lower-order odd-symmetric element, lower-order even-symmetric element, middle-order rotationally symmetric element, middle-order odd-symmetric element, middle-order even-symmetric element, and higher-order residual; and an evaluating step of evaluating whether thus calculated RMS value satisfies a predetermined condition or not.

10. An evaluating method according to claim 9, wherein said evaluating step evaluates whether at least one of the following conditions ($a_3$), ($b_3$), and ($c_3$) is satisfied or not:

($a_3$) each of the respective RMS values of the lower-order rotationally symmetric element, lower-order odd-symmetric element, and lower-order even-symmetric element is $0.06\lambda$ or less;

($b_3$) each of the respective RMS values of the middle-order rotationally symmetric element, middle-order odd-symmetric element, and middle-order even-symmetric element is $0.02\lambda$ or less; and ($c_3$) the RMS value of the higher-order residual is $0.01\lambda$ or less.

11. An evaluating method according to claim 9, wherein said evaluating step evaluates whether at least one of the following conditions ($a_4$), ($b_4$), and ($c_4$) is satisfied or not:

($a_4$) each of the respective RMS values of the lower-order rotationally symmetric element, lower-order odd-symmetric element, and lower-order even-symmetric element is $0.02\lambda$ or less;

($b_4$) each of the respective RMS values of the middle-order rotationally symmetric element, middle-order odd-symmetric element, and middle-order even-symmetric element is $0.008\lambda$ or less; and ($c_4$) the RMS value of the higher-order residual is $0.004\lambda$ or less.

12. An evaluating method according to claim 10, wherein said evaluating step evaluates whether all of said conditions ($a_3$), ($b_3$), and ($c_3$) are satisfied or not.

13. An evaluating method according to claim 11, wherein said evaluating step evaluates whether all of said conditions ($a_4$), ($b_4$), and ($c_4$) are satisfied or not.

14. An optical member for photolithography used in a specific wavelength band at a wavelength of 250 nm or shorter;

wherein, while a wavefront aberration measured upon transmitting light having a wavelength $\lambda$ through said optical member is expanded into a polynomial of a Zernike cylindrical function system, a rotationally symmetric element, an odd-symmetric element, and an even-symmetric element in a term where n=4 to 8 are defined as a lower-order rotationally symmetric element, a lower-order odd-symmetric element, and a lower-order even-symmetric element, respectively; a rotationally symmetric element, an odd-symmetric element, and an even-symmetric element in a term where n=9 to 35 are defined as a middle-order rotationally symmetric element, a middle-order odd-symmetric element, and a middle-order even-symmetric element, respectively; and a rotationally symmetric element, an odd-symmetric element, and an even-symmetric element in a term where n=35 to 80 are defined as a higher-order rotationally symmetric element, a higher-order odd-symmetric element, and a higher-order even-symmetric element, respectively; and a term where n>80 is defined as a residual; said optical member satisfying at least one of the following conditions ($a_1$), ($b_1$), ($c_1$) and ($d_1$):

($a_1$) each of the respective RMS values of the lower-order rotationally symmetric element, lower-order odd-symmetric element, and lower-order even-symmetric element is $0.06\lambda$ or less;

($b_1$) each of the respective RMS values of the middle-order rotationally symmetric element, middle-order odd-symmetric element, and middle-order even-symmetric element is $0.02\lambda$ or less;

($c_1$) each of the respective RMS values of the higher-order rotationally symmetric element, higher-order odd-symmetric element, and higher-order even-symmetric element is $0.005\lambda$ or less; and ($d_1$) the RMS value of the residual is $0.006\lambda$ or less.

15. An optical member according to claim 14, wherein said optical member satisfies all of said conditions ($a_1$) ($b_1$), (c1), and ($d_1$).

16. A projection optical system employed in a photolithography exposure apparatus used in a specific wavelength band at a wavelength of 250 nm or shorter, wherein at least 90% of lenses constituting said projection optical system comprise the optical member according to claim 14.

17. A photolithography exposure apparatus used in a specific wavelength band at a wavelength of 250 nm or shorter, said exposure apparatus comprising the projection optical system according to claim 16.

18. An optical member according to claim 14, wherein said optical member satisfies at least one of the following conditions ($a_2$), ($b_2$), ($c_2$), and ($d_2$):

($a_2$) each of the respective RMS values of the lower-order rotationally symmetric element, lower-order odd-symmetric element, and lower-order even-symmetric element is $0.02\lambda$ or less;

($b_2$) each of the respective RMS values of the middle-order rotationally symmetric element, middle-order odd-symmetric element, and middle-order even-symmetric element is $0.008\lambda$ or less;

($c_2$) each of the respective RMS values of the higher-order rotationally symmetric element, higher-order odd-symmetric element, and higher-order even-symmetric element is $0.003\lambda$ or less; and ($d_2$) the RMS value of the residual is $0.004\lambda$ or less.

19. An optical member according to claim 18, wherein said optical member satisfies all of said conditions ($a_2$) ($b_2$), ($c_2$), and ($d_2$).

20. An optical member for photolithography used in a specific wavelength band at a wavelength of 250 nm or shorter;

wherein, while a wavefront aberration measured upon transmitting light having a wavelength $\lambda$ through said optical member is expanded into a polynomial of a Zernike cylindrical function system, a rotationally symmetric element, an odd-symmetric element, and an even-symmetric element in a term where n=4 to 8 are defined as a lower-order rotationally symmetric element, a lower-order odd-symmetric element, and a lower-order even-symmetric element, respectively; a rotationally symmetric element, an odd-symmetric element, and an even-symmetric element in a term where n=9 to 35 are defined as a middle-order rotationally symmetric element, a middle-order odd-symmetric element, and a middle-order even-symmetric element, respectively; and a term where n>35 is defined as a higher-order residual; said optical member satisfying at least one of the following conditions ($a_3$), ($b_3$), and ($c_3$):

($a_3$) each of the respective RMS values of the lower-order rotationally symmetric element, lower-order odd-symmetric element, and lower-order even-symmetric element is 0.06λ or less;

($b_3$) each of the respective RMS values of the middle-order rotationally symmetric element, middle-order odd-symmetric element, and middle-order even-symmetric element is 0.02λ or less; and ($c_3$) the RMS value of the higher-order residual is 00.1λ or less.

21. An optical member according to claim 20, wherein said optical member satisfies at least one of the following conditions (a4), ($b_4$), and ($c_4$):

($a_4$) each of the respective RMS values of the lower-order rotationally symmetric element, lower-order odd-symmetric element, and lower-order even-symmetric element is 0.02λ or less;

($b_4$) each of the respective RMS values of the middle-order rotationally symmetric element, middle-order odd-symmetric element, and middle-order even-symmetric element is 0.008λ or less; and ($c_4$) the RMS value of the higher-order residual is 0.004λ or less.

22. An optical member according to claim 20, wherein said optical member satisfies all of said conditions ($a_3$) ($b_3$), and ($c_3$).

23. An optical member according to claim 21, wherein said optical member satisfies all of said conditions ($a_4$) ($b_4$), and ($c_4$).

* * * * *